(12) United States Patent
Yamazaki et al.

(10) Patent No.: US 8,753,928 B2
(45) Date of Patent: Jun. 17, 2014

(54) METHOD OF MANUFACTURING SEMICONDUCTOR DEVICE

(75) Inventors: Shunpei Yamazaki, Setagaya (JP); Yuhei Sato, Atsugi (JP); Keiji Sato, Isehara (JP); Tetsunori Maruyama, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 99 days.

(21) Appl. No.: 13/413,686

(22) Filed: Mar. 7, 2012

(65) Prior Publication Data

US 2012/0231581 A1   Sep. 13, 2012

(30) Foreign Application Priority Data

Mar. 11, 2011   (JP) ................. 2011-054815

(51) Int. Cl.
*H01L 21/00* (2006.01)
*H01L 21/84* (2006.01)

(52) U.S. Cl.
USPC ........... 438/151; 438/104; 438/149; 438/482; 438/486; 438/542; 438/764

(58) Field of Classification Search
USPC .......... 438/104, 149, 151, 482, 486, 542, 764
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. 85, No. 13, pp. 2541-2543.

(Continued)

*Primary Examiner* — Bac Au
(74) *Attorney, Agent, or Firm* — Eric J. Robinson; Robinson Intellectual Property Law Office, P.C.

(57) ABSTRACT

In a process of manufacturing a transistor including an oxide semiconductor layer, an amorphous oxide semiconductor layer which includes a region containing excess oxygen as compared to a stoichiometric composition ratio of an oxide semiconductor in a crystalline state is formed over a silicon oxide film, an aluminum oxide film is formed over the amorphous oxide semiconductor layer, and then heat treatment is performed so that at least part of the amorphous oxide semiconductor layer is crystallized and an oxide semiconductor layer which includes a crystal having a c-axis substantially perpendicular to a surface of the oxide semiconductor layer is formed.

14 Claims, 16 Drawing Sheets

(56) References Cited

U.S. PATENT DOCUMENTS

| | | | |
|---|---|---|---|
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,642,573 B2 | 1/2010 | Hoffman et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 7,838,348 B2 | 11/2010 | Hoffman et al. | |
| 8,093,136 B2 | 1/2012 | Endo et al. | |
| 8,377,744 B2* | 2/2013 | Yamazaki et al. | 438/104 |
| 8,389,417 B2* | 3/2013 | Yamazaki et al. | 438/722 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0321731 A1 | 12/2009 | Jeong et al. | |
| 2010/0051938 A1 | 3/2010 | Hayashi et al. | |
| 2010/0065844 A1 | 3/2010 | Tokunaga | |
| 2010/0090217 A1 | 4/2010 | Akimoto | |
| 2010/0092800 A1 | 4/2010 | Itagaki et al. | |
| 2010/0109002 A1 | 5/2010 | Itagaki et al. | |
| 2010/0117075 A1 | 5/2010 | Akimoto et al. | |
| 2010/0295041 A1 | 11/2010 | Kumomi et al. | |
| 2011/0037068 A1* | 2/2011 | Yamazaki et al. | 257/43 |
| 2011/0049510 A1* | 3/2011 | Yamazaki et al. | 257/43 |
| 2011/0084266 A1* | 4/2011 | Yamazaki et al. | 257/43 |
| 2011/0101335 A1* | 5/2011 | Yamazaki et al. | 257/43 |
| 2011/0115763 A1* | 5/2011 | Yamazaki et al. | 345/204 |
| 2011/0147738 A1* | 6/2011 | Yamazaki et al. | 257/43 |
| 2012/0001170 A1 | 1/2012 | Yamazaki | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-026119 | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| JP | 2007-073698 | 3/2007 |
| WO | WO-2004/114391 | 12/2004 |

OTHER PUBLICATIONS

Dembo.H et al., "RFCPUS On Glass And Plastic Substrates Fabricated By TFT Transfer Technology,", IEDM 05: Technical Digest Of International Electron Devices Meeting, Dec. 5, 2005, pp. 1067-1069.

Ikeda.T et al., "Full-Functional System Liquid Crystal Display Using CG-Silicon Technology,", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin Film Transistors By A Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW'08: Proceedings of the 15th International Display Workshops, Dec. 3, 2008, pp. 1637-1640.

(56) References Cited

OTHER PUBLICATIONS

Hayashi.R et al., "42.1: Invited Paper: Improved Amorphous In-Ga-Zn-O TFTS,", SID Digest '08: SID International Symposium Digest of Technical Papers, May 20, 2008, vol. 39, pp.621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350°C,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m=7, 8, 9, and 16) in the In2O3-ZnGa2O4-ZnO Systems",Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.n. et al., "Crystallization and Reduction of SOL-GEL-Derived Zinc Oxide Films By Irradiation With Ultraviolet Lamp,", Journal of SOL-GEL Science and Technology, 2003, vol. 26, pp. 181-184.

Osada.T et al., "15.2: Development of Driver-Integrated Panel using Amorphous In-Ga-Zn-Oxide TFT,", SID Digest '09: SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=in,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous Gizo (Ga2O3=In2O3-ZnO) TFT,", SID Digest '08: SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08: SID International Symposium Digest of Technical Paper, May 20, 2008, vol. 39, pp. 625-628.

Nowatari.H et al., "60.2: Intermediate Connector With Suppressed Voltage Loss for White Tandem Oldeds,", SID Digest '09: SID International Symposium Digest of Technical Papers, May 31, 2009, vol. 40, pp. 899-902.

Kanno.H et al., "White Stacked Electrophosphorecent Organic Light-Emitting Devices Light-Emitting Devices Employing MOO3 as a Charge-Generation Layer,", AVD. Mater. (Advanced Materials), 2006, vol. 18, No. 3, pp. 339-342.

Tsuda.K et al., "Ultra Low Power Consumption Technologies for Mobile TFT-LCDs,", IDW '02: Proceedings of the 9TH International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08: SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase", " Physics Letters, Sep. 10, 1973, vol. 45A, No. 2, pp. 115-116.

Cho.D et al., "21.2:AL and SN-Doped Zinc Indium Oxide Thin Film Transistors for AMOLED Back Plane,", SID Digest '09: SID International Symposium Digest of Digest of Technical Papers, May 31, 2009, pp. 280-283.

Lee.M et al., "15.4: Excellent Performance of Indium-Oxide-Based Thin-Film Transistors by DC Sputtering,", SID Digest '09: SID International Symposium Digest of Technical Papers, May 31, 2009, pp. 191-193.

Jin.D et al., "65.2:Distinguished Paper:World-Largest (6.5) Flexible Full Color Top Emission AMOLED Display on Plastic Film and Its Bending Properties,", SID Digest '09: SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTS,", IDW '09: Proceedings of the 16TH International Display Workshops, 2009, pp. 689-692.

Park.J et al., "Amorphous Indium-Gallium-Zinc Oxide TIFS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure For Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07: SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09: SID International Symposium Digest of Technical Papers, May 31, 2009, pp. 1110-1112.

Ohara.H et al., "21.3:4.0 In. QVGA AMOLED Display Using In-Ga-Zn-Oxide TFTS With a Novel Passivation Layer,", SID Digest '09: SID International Symposium Digest of Technical Papers, May 31, 2009, pp. 284-287.

Miyasaka.M, "Suftla Flexible Microelectronics on Their Way to Business,", SID Digest '07: SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper: Optically Isotropic Nano-Structured Liquid Crystal Composites for Display Applications,", SID Digest '09: SID International Symposium Digest of Technical Papers, May. 31, 2009, pp. 578-581.

Asaoka.Y et al., "29.1: Polarizer-Free Reflective LCD Combined With Ultra Low-Power Driving Technolgy,", SID Digest '09: SID International Symposium Digest of Technical Papers, May 31, 2009, pp. 395-398.

(56) References Cited

OTHER PUBLICATIONS

Lee.H et al., "Current Status of, Challenges to, and Perspective View of AM-OLED,", IDW '06: Proceedings of the 13th International Display Workshops, Dec. 7, 2006, pp. 663-666.

Kikuchi.H et al., "62.2: Invited Paper:Fast Electro-Optical Switching in Polymer-Stabilized Liquid Crystalline Blue for Display Application,", SID Digest '07: SID International Symposium Digest of Technical Papers, 2007, vol. 38, pp. 1737-1740.

Nakamura.M, "Synthesis of Homolgous Compound with Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the IN2O3 and SC2O3-A2O3-BO Systems [A; FE, GA, or AL; B: MG, MN, FE, NI, CU, or ZN]at Temperatures Over 1000°C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08: SID International Symposium Digest of Technical Papers, May 20, 2008, vol. 39, pp. 629-632.

Orita.M et al., "Mechanism of Electrical Conductivity of Transparent InGaZn04,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", JPN. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density 'functional study,", Phys. Rev. B (Physical Review. B), 2008, vol. 77, pp. 245202-1-245202-6.

Orita.M et al., "Amorphous transparent conductive oxide InGa03(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08: Proceedings of the 6TH International Display Workshops, Dec. 3, 2008, pp. 581-584.

Kim.S et al., "High-Performance oxide thin film transistors passivated by various gas plasmas,", 214TH ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J of al., "Dry etching of ZnO films and plasma-induced damage to optical properties,", J. VAC. SCI. Technol. B (Journal of Vacuum Science & Technology B), Mar. 1, 2003, vol. 21, No. 2, pp. 800-803.

Oh.M et al., "Improvingthe Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K of al., "Field-Effect Transistor on SrTiO3 With Sputtered A1203 Gate Insulator,", Appl. Phys. Lett. (Applied Physics Letters), Sep. 1, 2003, vol. 83, No. 9, pp. 1755-1757.

\* cited by examiner

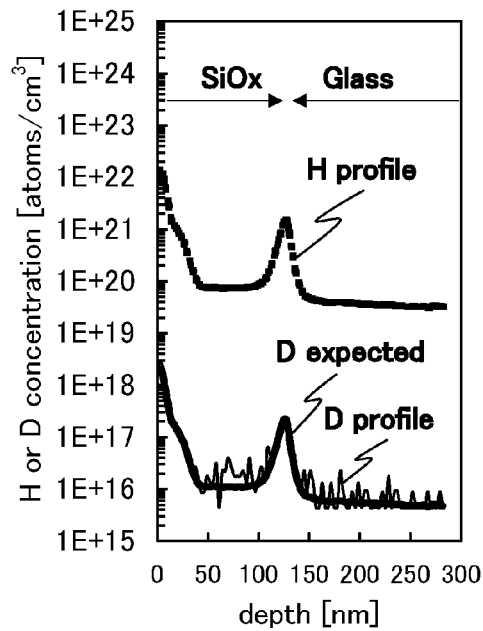
FIG. 13A1
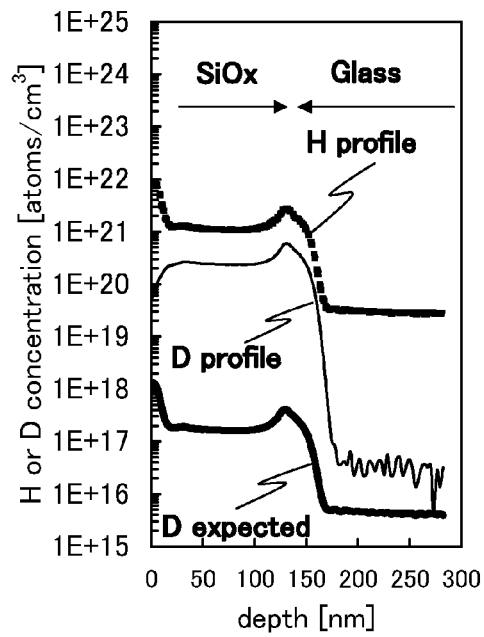
FIG. 13A2
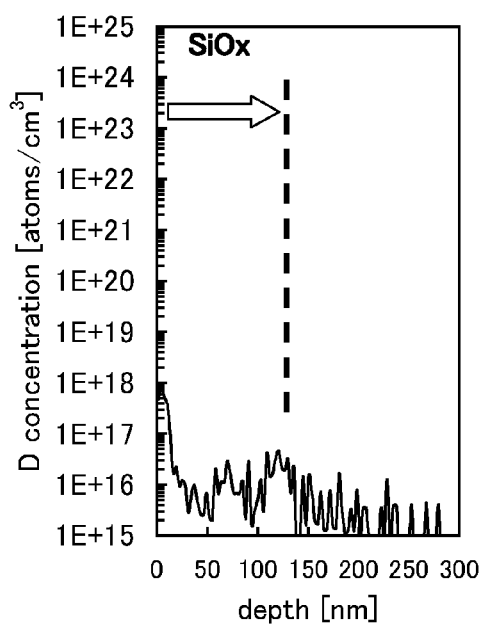
FIG. 13B1
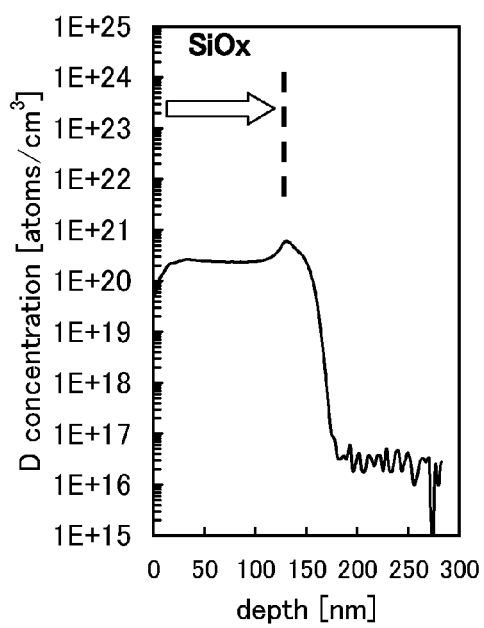
FIG. 13B2

FIG. 14A1
FIG. 14A2
FIG. 14B1
FIG. 14B2
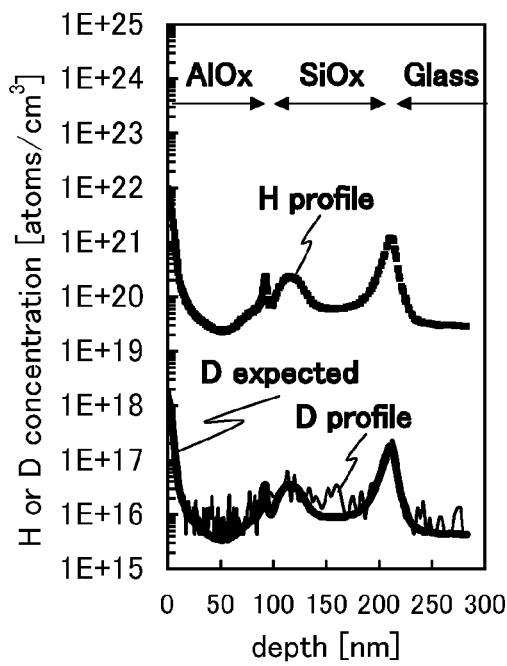
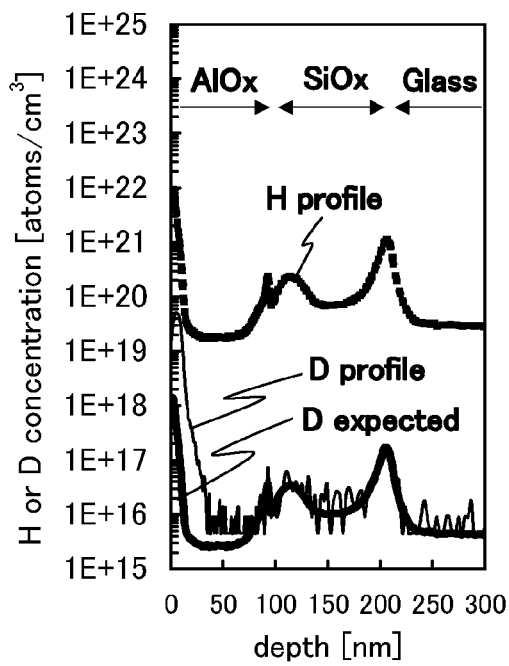
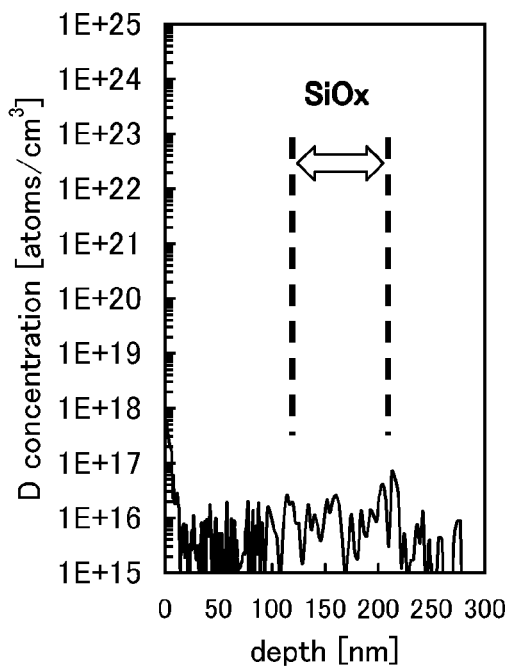
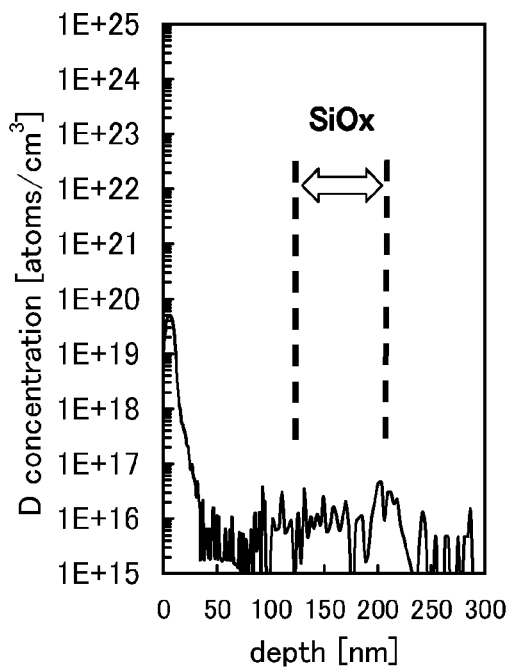

METHOD OF MANUFACTURING SEMICONDUCTOR DEVICE

BACKGROUND OF THE INVENTION

1. Field of the Invention

The present invention relates to a semiconductor device and a method of manufacturing the semiconductor device.

In this specification, a semiconductor device generally means a device which can function by utilizing semiconductor characteristics, and an electrooptic device, a semiconductor circuit, and an electronic appliance are all semiconductor devices.

2. Description of the Related Art

Attention has been focused on a technique for forming a transistor (also referred to as a thin film transistor (TFT)) using a semiconductor thin film formed over a substrate having an insulating surface. The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor whose active layer includes an amorphous oxide containing indium (In), gallium (Ga), and zinc (Zn) and having an electron carrier concentration of less than $10^{18}/cm^3$ is disclosed (see Patent Document 1).

REFERENCE

Patent Document

[Patent Document 1] Japanese Published Patent Application No. 2006-165528

SUMMARY OF THE INVENTION

However, the electric conductivity of an oxide semiconductor changes when deviation from the stoichiometric composition occurs, or hydrogen or moisture forming an electron donor enters the oxide semiconductor in a process of forming a thin film of the oxide semiconductor. Such a phenomenon causes variation in the electric characteristics of a transistor including the oxide semiconductor.

In view of the above problems, an object is to provide a semiconductor device including an oxide semiconductor, which has stable electric characteristics and high reliability.

Specifically, in a process of manufacturing a transistor including an oxide semiconductor layer, an amorphous oxide semiconductor layer which includes a region containing excess oxygen as compared to a stoichiometric composition ratio of an oxide semiconductor in a crystalline state is formed over a silicon oxide film, an aluminum oxide film is formed over the amorphous oxide semiconductor layer, and then heat treatment is performed so that at least part of the amorphous oxide semiconductor layer is crystallized and an oxide semiconductor layer which includes a crystal having a c-axis substantially perpendicular to a surface of the oxide semiconductor layer is formed.

The oxide semiconductor layer which includes a crystal having a c-axis substantially perpendicular to a surface of the oxide semiconductor layer (hereinafter also referred to as a crystalline oxide semiconductor layer) has neither a single crystal structure nor an amorphous structure, and includes an oxide including a crystal with c-axis alignment (also referred to as a C-Axis Aligned Crystal (CAAC)). With the crystalline oxide semiconductor layer, it is possible to provide a highly reliable semiconductor device having less variation in the electric characteristics of the transistor due to irradiation with visible light or ultraviolet light.

The oxide semiconductor layer (the amorphous oxide semiconductor layer and the crystalline oxide semiconductor layer) includes the region containing excess oxygen as compared to a stoichiometric composition ratio of an oxide semiconductor in a crystalline state. In that case, the oxygen content is higher than that in the stoichiometric composition ratio of the oxide semiconductor. Alternatively, the oxygen content is higher than that of the oxide semiconductor in a single crystal state. In some cases, oxygen may exist between lattices of the oxide semiconductor. For example, in the case of a material whose single crystalline structure is represented by $InGaO_3(ZnO)_m$ (m>0), the composition of the oxide semiconductor is represented by $InGaZn_mO_{m+3}$; thus, when m=1 ($InGaZnO_4$) for example, an oxide semiconductor layer which includes an oxygen excess region with a composition where x in $InGaZnO_x$ (x>0) is greater than 4 is used. Such an oxygen excess region may exist in part (including an interface) of the oxide semiconductor layer.

Oxygen contained in the oxide semiconductor layer dynamically repeats reactions of bonding with and desorption from a metal element in the oxide semiconductor as shown in the following formula (1). A metal element from which oxygen is desorbed has a dangling bond, whereby an oxygen vacancy exists in a position of the oxide semiconductor layer, where the oxygen is desorbed.

[Formula (1)]

$$M-O \rightleftharpoons M+O \quad (1)$$

An oxide semiconductor layer according to one embodiment of the disclosed invention contains excess oxygen (preferably at an amount exceeding that in a stoichiometric composition ratio of an oxide semiconductor) so as to immediately compensate such an oxygen vacancy. Therefore, it is possible to reduce density of states (DOS) due to oxygen vacancies in the layer. For example, when the oxide semiconductor layer contains oxygen at an amount which corresponds to that in the stoichiometric composition ratio of the oxide semiconductor and the average DOS is approximately higher than or equal to $10^{18}$ cm$^{-3}$ and lower than or equal to $10^{19}$ cm$^{-3}$, the average DOS of the oxide semiconductor containing oxygen at an amount exceeding that in the stoichiometric composition ratio of the oxide semiconductor can be approximately higher than or equal to $10^{15}$ cm$^{-3}$ and lower than or equal to $10^{16}$ cm$^{-3}$.

The excess oxygen in the oxide semiconductor layer can immediately compensate an oxygen vacancy generated in the layer; thus, time for formation of a donor level due to an oxygen vacancy can be shortened, and the number of the donor levels in the layer can be reduced or the donor levels can be substantially removed.

The aluminum oxide film provided over the oxide semiconductor layer has a high shielding effect (blocking effect) and thus is less likely to transmit both oxygen and impurities such as hydrogen, moisture, a hydroxyl group, and hydride (also referred to as a hydrogen compound).

Accordingly, the aluminum oxide film serves as a protection film that prevents entry of impurities such as hydrogen and moisture, which cause variation in the electric characteristics of a transistor, into the oxide semiconductor layer and release of oxygen, which is a main component material of the oxide semiconductor, from the oxide semiconductor layer during and after the manufacturing process.

The heat treatment for crystallizing the amorphous oxide semiconductor layer is performed in a state where the amorphous oxide semiconductor layer is interposed between the silicon oxide film and the aluminum oxide film; therefore, oxygen can be prevented from being released from the amorphous oxide semiconductor layer by the heat treatment for crystallization. Thus, the crystalline oxide semiconductor layer obtained in this manner can maintain the amount of oxygen which has been contained in the amorphous oxide semiconductor layer, and include the region containing excess oxygen as compared to a stoichiometric composition ratio of an oxide semiconductor in a crystalline state.

Therefore, the crystalline oxide semiconductor layer formed has high purity because impurities such as hydrogen and moisture are not mixed therein, and includes the region containing excess oxygen as compared to a stoichiometric composition ratio of an oxide semiconductor in a crystalline state because oxygen is prevented from being released. Accordingly, by using the crystalline oxide semiconductor layer for the transistor, it is possible to reduce variation in the threshold voltage ($V_{th}$) of the transistor due to an oxygen vacancy and a shift of the threshold voltage ($\Delta V_{th}$).

The silicon oxide film preferably includes a region containing excess oxygen as compared to a stoichiometric composition ratio of crystalline silicon oxide. In that case, the oxygen content is higher than that in a stoichiometric composition ratio of silicon oxide. Alternatively, the oxygen content is higher than that in single crystal silicon oxide. In some cases, oxygen may exist between lattices of silicon oxide. In the case of a silicon oxide film whose composition is represented by $SiO_x$ (x>0), since the stoichiometric composition ratio of silicon oxide is Si:O=1:2, it is preferable to use a silicon oxide film which includes an oxygen excess region with a composition where x is greater than 2. Such an oxygen excess region may exist in part (including an interface) of the silicon oxide film.

The silicon oxide film in contact with the oxide semiconductor layer contains a large amount of oxygen so as to suitably serve as a source of oxygen to be supplied to the oxide semiconductor layer.

The aluminum oxide film preferably includes a region containing excess oxygen as compared to a stoichiometric composition ratio of crystalline aluminum oxide. In that case, the oxygen content is higher than that in a stoichiometric composition ratio of aluminum oxide. Alternatively, the oxygen content is higher than that in single crystal aluminum oxide. In some cases, oxygen may exist between lattices of aluminum oxide. In the case where the composition is represented by $AlO_x$ (x>0), since the stoichiometric composition ratio of aluminum oxide is Al:O=3:2, it is preferable to use an aluminum oxide film which includes an oxygen excess region with a composition where x is greater than 3/2. Such an oxygen excess region may exist in part (including an interface) of the aluminum oxide film.

Before the aluminum oxide film is formed, it is preferable to perform heat treatment for dehydration or dehydrogenation on the amorphous oxide semiconductor layer so as to intentionally remove a hydrogen atom, an impurity containing a hydrogen atom such as water, and the like from the oxide semiconductor layer.

Since hydrogen, which is an n-type impurity, is removed from the oxide semiconductor and the oxide semiconductor is highly purified so as not to contain impurities as much as possible, the oxide semiconductor can be an I-type (intrinsic) oxide semiconductor or a substantially I-type (intrinsic) oxide semiconductor. In other words, by removing impurities such as hydrogen and water as much as possible, it is possible to obtain a highly purified I-type (intrinsic) semiconductor or a semiconductor close thereto. This enables the Fermi level ($E_f$) of the oxide semiconductor to be at the same level as the intrinsic Fermi level ($E_i$) thereof.

One embodiment of a configuration of the invention disclosed in this specification is a method of manufacturing a semiconductor device including the following steps: forming a silicon oxide film, an aluminum oxide film, and an amorphous oxide semiconductor layer interposed between the silicon oxide film and the aluminum oxide film; and performing heat treatment on the amorphous oxide semiconductor layer so that at least part of the amorphous oxide semiconductor layer is crystallized and an oxide semiconductor layer which includes a crystal having a c-axis substantially perpendicular to a surface of the oxide semiconductor layer is formed. Further, the amorphous oxide semiconductor layer includes a region containing excess oxygen as compared to a stoichiometric composition ratio of an oxide semiconductor in a crystalline state.

Another embodiment of a configuration of the invention disclosed in this specification is a method of manufacturing a semiconductor device including the following steps: forming a silicon oxide film; forming an amorphous oxide semiconductor layer over the silicon oxide film; performing first heat treatment on the amorphous oxide semiconductor layer so that hydrogen or moisture contained in the amorphous oxide semiconductor layer is released; forming an aluminum oxide film over the amorphous oxide semiconductor layer, which has been subjected to the first heat treatment; and performing second heat treatment on the amorphous oxide semiconductor layer, which has been subjected to the first heat treatment, at a temperature higher than a temperature of the first heat treatment so that at least part of the amorphous oxide semiconductor layer is crystallized and an oxide semiconductor layer which includes a crystal having a c-axis substantially perpendicular to a surface of the oxide semiconductor layer is formed. Further, the amorphous oxide semiconductor layer includes a region containing excess oxygen as compared to a stoichiometric composition ratio of an oxide semiconductor in a crystalline state.

A transistor which includes such a highly purified crystalline oxide semiconductor layer containing excess oxygen which compensates an oxygen vacancy has less variation in electric characteristics and is electrically stable. Accordingly, it is possible to provide a highly reliable semiconductor device which includes the oxide semiconductor and has stable electric characteristics.

By providing the aluminum oxide film over the crystalline oxide semiconductor layer so that excess oxygen contained in the oxide semiconductor layer is not released by heat treatment, it is possible to prevent generation and increase of a defect in the crystalline oxide semiconductor layer and at interfaces between the crystalline oxide semiconductor layer and an upper and lower layers in contact with the crystalline oxide semiconductor layer. That is, excess oxygen contained in the crystalline oxide semiconductor layer acts to fill an oxygen-vacancy defect, so that a highly reliable semiconductor device having stable electric characteristics can be provided.

Consequently, according to one embodiment of the disclosed invention, a transistor having stable electric characteristics can be manufactured.

According to another embodiment of the disclosed invention, a highly reliable semiconductor device having favorable electric characteristics can be manufactured.

BRIEF DESCRIPTION OF THE DRAWINGS

In the accompanying drawings:

FIGS. 13A1, 13A2, 13B1, and 13B2 show SIMS data of a comparative sample A;

FIGS. 14A1, 14A2, 14B1, and 14B2 show SIMS data of an example sample A;

DETAILED DESCRIPTION OF THE INVENTION

Hereinafter, embodiments of the invention disclosed in this specification will be described with reference to the accompanying drawings. Note that the invention disclosed in this specification is not limited to the following description, and it is easily understood by those skilled in the art that modes and details can be variously changed without departing from the spirit and the scope of the invention. Therefore, the invention disclosed in this specification is not construed as being limited to the description of the following embodiments. Note that the ordinal numbers such as "first" and "second" in this specification are used for convenience and do not denote the order of steps and the stacking order of layers. In addition, the ordinal numbers in this specification do not denote particular names which specify the invention.

Embodiment 1

This embodiment shows an embodiment of a semiconductor device and a method of manufacturing the semiconductor device with reference to FIGS. 1A to 1E. In this embodiment, a transistor including an oxide semiconductor layer is shown as an example of the semiconductor device.

There is no particular limitation on the structure of the transistor; for example, a staggered type transistor or a planar type transistor having a top-gate structure or a bottom-gate structure can be employed. Further, the transistor may have a single gate structure including one channel formation region, or a multi gate structure such as a double gate structure including two channel formation regions or a triple gate structure including three channel formation regions. Alternatively, the transistor may have a dual gate structure including two gate electrode layers positioned over and below a channel region with a gate insulating layer provided therebetween.

Figure 1A:
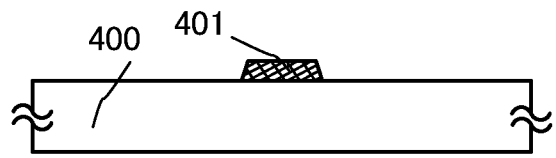
FIGS. 1A to 1E illustrate one embodiment of a semiconductor device and a method of manufacturing the semiconductor device.
Figure 1B:
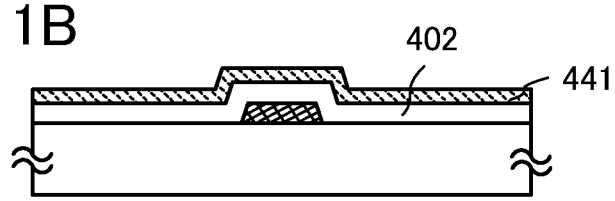
Figure 1C:
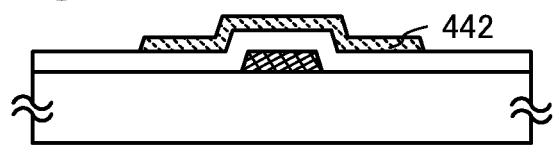
Figure 1D:
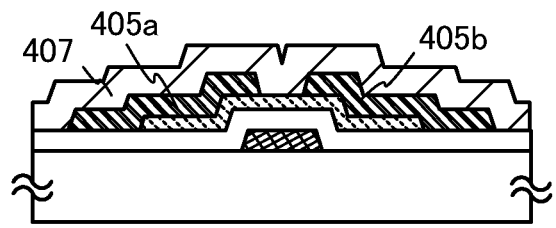
Figure 1E:
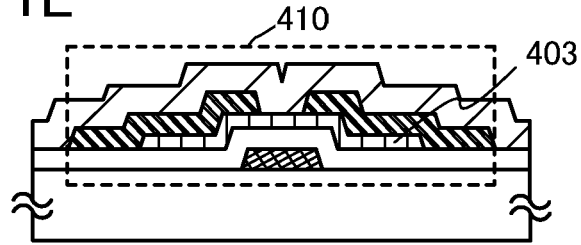

As shown in FIG. 1E, a transistor 410 includes, over a substrate 400 having an insulating surface, a gate electrode layer 401, a gate insulating layer 402, a crystalline oxide semiconductor layer 403, a source electrode layer 405a, and a drain electrode layer 405b. An oxide insulating layer 407 is formed over the transistor 410.

The oxide insulating layer 407 may have a single-layer structure or a layered structure, and includes an aluminum oxide film. In this embodiment, the gate insulating layer 402 is formed using a silicon oxide film and the oxide insulating layer 407 is formed using an aluminum oxide film.

The crystalline oxide semiconductor layer 403 is an oxide semiconductor layer which has an a-b plane substantially parallel to a surface of the crystalline oxide semiconductor layer and includes a crystal having a c-axis substantially perpendicular to the surface. Furthermore, the crystalline oxide semiconductor layer 403 has neither a single crystal structure nor an amorphous structure and includes an oxide including a crystal with c-axis alignment (CAAC). With the crystalline oxide semiconductor layer, it is possible to provide a highly reliable semiconductor device having less variation in the electric characteristics of the transistor due to irradiation with visible light or ultraviolet light.

FIGS. 1A to 1E illustrate an example of a method of manufacturing the transistor 410.

First, a conductive film is formed over the substrate 400 having an insulating surface, and then, the gate electrode layer 401 is formed by a first photolithography step. Note that a resist mask may be formed by an inkjet method. Formation of the resist mask by an inkjet method needs no photomask; thus, manufacturing cost can be reduced.

There is no particular limitation on a substrate that can be used as the substrate 400 having an insulating surface as long as it has heat resistance enough to withstand heat treatment performed later. For example, a glass substrate such as barium borosilicate glass, and aluminoborosilicate glass, a ceramic substrate, a quartz substrate, or a sapphire substrate can be used. Alternatively, a single-crystal semiconductor substrate or a polycrystalline semiconductor substrate of silicon, silicon carbide, or the like; a compound semiconductor substrate of silicon germanium or the like; an SOI substrate; or the like can be used as the substrate 400. Still alternatively, any of these substrates over which a semiconductor element is provided may be used as the substrate 400.

The semiconductor device may be manufactured using a flexible substrate as the substrate 400. In order to manufacture a flexible semiconductor device, the transistor 410 including the crystalline oxide semiconductor layer 403 may be directly formed over a flexible substrate. Alternatively, the transistor 410 including the crystalline oxide semiconductor layer 403 may be formed over a formation substrate, and then, the transistor 410 may be separated and transferred to a flexible substrate. Note that in order to separate the transistor from the formation substrate and transfer it to the flexible substrate, a separation layer is preferably provided between the formation substrate and the transistor including an oxide semiconductor layer.

An insulating film serving as a base film may be provided between the substrate 400 and the gate electrode layer 401. The base film has a function of preventing diffusion of an impurity element from the substrate 400, and can be formed with a single-layer structure or a layered structure using one or more of a silicon nitride film, a silicon oxide film, a silicon nitride oxide film, and a silicon oxynitride film.

The gate electrode layer 401 can be formed with a single-layer structure or a layered structure using a metal material such as molybdenum, titanium, tantalum, tungsten, aluminum, copper, neodymium, or scandium, and/or an alloy material which contains any of these materials as a main component by a plasma CVD method, a sputtering method, or the like.

The gate electrode layer 401 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, or a nitride of the light-transmitting conductive material. It is also possible to have a layered structure formed using the above light-transmitting conductive material and the above metal material.

Further, the layered structure of the gate electrode layer 401 may include, as one layer in the layered structure, an In—Sn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, or a Zn—O-based metal oxide. It is particularly preferable that the gate electrode layer 401 have a layered structure including, as one layer in the layered structure, an oxynitride film containing indium, gallium, and zinc which are materials having a high work function (also referred to as an IGZON film). The oxynitride film containing indium, gallium, and zinc is formed in a mixed gas atmosphere containing argon and nitrogen.

For example, the gate electrode layer 401 can be formed with a layered structure by stacking a copper film, a tungsten film, and an oxynitride film containing indium, gallium, and zinc (IGZON film) in that order over the substrate 400, or by stacking a tungsten film, a tungsten nitride film, a copper film, and a titanium film in that order over the substrate 400.

Next, the gate insulating layer 402 is formed over the gate electrode layer 401 by a plasma CVD method, a sputtering method, or the like (see FIG. 1B). The gate insulating layer 402 may have a single-layer structure or a layered structure, and a film to be in contact with the crystalline oxide semiconductor layer 403 is formed using a silicon oxide film.

The silicon oxide film to be in contact with the crystalline oxide semiconductor layer 403 preferably includes a region containing excess oxygen as compared to a stoichiometric composition ratio of crystalline silicon oxide. In that case, the oxygen content is higher than that in a stoichiometric composition ratio of silicon oxide. Alternatively, the oxygen content is higher than that in single crystal silicon oxide. In some cases, oxygen may exist between lattices of silicon oxide. In the case of a silicon oxide film whose composition is represented by $SiO_x$ (x>0), since the stoichiometric composition ratio of silicon oxide is Si:O=1:2, it is preferable to use a silicon oxide film which includes an oxygen excess region with a composition where x is greater than 2. Such an oxygen excess region may exist in part (including an interface) of the silicon oxide film.

The silicon oxide film in contact with the crystalline oxide semiconductor layer 403 contains a large amount of oxygen so as to suitably serve as a source of oxygen to be supplied to the oxide semiconductor layer.

When the gate insulating layer 402 has a layered structure, film(s) other than the film(s) to be in contact with the crystalline oxide semiconductor layer 403 can be formed using one or more of silicon nitride, silicon oxynitride, silicon nitride oxide, aluminum oxide, aluminum nitride, aluminum oxynitride, aluminum nitride oxide, hafnium oxide, and gallium oxide, by a plasma CVD method, a sputtering method, or the like.

In order that hydrogen, a hydroxyl group, and moisture are not contained as much as possible in the gate insulating layer 402 and an oxide semiconductor film provided over the gate insulating layer 402, it is preferable that the substrate 400 over which the gate electrode layer 401 is formed or the substrate 400 over which layers up to and including the gate insulating layer 402 are formed be preheated in a preheating chamber of a sputtering apparatus as pretreatment for the formation of the oxide semiconductor film, so that impurities such as hydrogen and moisture adsorbed to the substrate 400 are desorbed and removed. An exhaustion unit provided for the preheating chamber is preferably a cryopump. Note that this preheating treatment can be skipped. This preheating may be similarly performed on the substrate 400 over which layers up to and including the source electrode layer 405a and the drain electrode layer 405b are formed, before the formation of the oxide insulating layer 407.

Next, over the gate insulating layer 402, an amorphous oxide semiconductor film 441 with a thickness of greater than or equal to 2 nm and less than or equal to 200 nm, preferably greater than or equal to 5 nm and less than or equal to 30 nm is formed (see FIG. 1B).

The amorphous oxide semiconductor film 441 includes a region containing excess oxygen as compared to a stoichiometric composition ratio of an oxide semiconductor in a crystalline state. In that case, the oxygen content is higher than that in a stoichiometric composition ratio of an oxide semiconductor. Alternatively, the oxygen content is higher than that in the oxide semiconductor in a single crystal state. In some cases, oxygen may exist between lattices of the oxide semiconductor. For example, in the case of a material whose single crystalline structure is represented by $InGaO_3(ZnO)_m$ (m>0), the composition of the oxide semiconductor is represented by $InGaZn_mO_{m+3}$; thus, when m=1 ($InGaZnO_4$) for example, an amorphous oxide semiconductor film which includes an oxygen excess region with a composition where x in $InGaZnO_x$ (x>0) is greater than 4 is used. Such an oxygen excess region may exist in part (including an interface) of the amorphous oxide semiconductor film.

The amorphous oxide semiconductor film 441 is made to include the region containing excess oxygen as compared to a stoichiometric composition ratio of an oxide semiconductor in a crystalline state, either by performing film formation under conditions so that a large amount of oxygen can be contained therein or by introducing oxygen (including at least one of an oxygen radical, an oxygen atom, and an oxygen ion) to the amorphous oxide semiconductor film 441 after film formation thereof. Oxygen can be introduced by an ion implantation method, an ion doping method, a plasma immersion ion implantation method, plasma treatment, or the like.

Note that before the amorphous oxide semiconductor film 441 is formed by a sputtering method, powder substances (also referred to as particles or dust) which are attached on a surface of the gate insulating layer 402 are preferably removed by reverse sputtering in which an argon gas is introduced and plasma is generated. The reverse sputtering is a method in which voltage is applied to a substrate side, not to a target side, in an argon atmosphere by using an RF power supply and plasma is generated in the vicinity of the substrate to modify a surface. Note that nitrogen, helium, oxygen, or the like may be used instead of argon.

As an oxide semiconductor used for the amorphous oxide semiconductor film 441, any of the following oxide semiconductors can be used: a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; an In—O-based oxide semiconductor; a Sn—O-based oxide semiconductor; a Zn—O-based oxide semiconductor; and the like. Further, the above oxide semiconductor may contain $SiO_2$. Here, for example, an In—Ga—Zn—O-based oxide semiconductor means an oxide film containing indium (In), gallium (Ga), and zinc (Zn), and there is no particular limitation on the stoichiometric composition ratio thereof. The In—Ga—Zn—O-based oxide semiconductor may contain an element other than In, Ga, and Zn.

In addition, the amorphous oxide semiconductor film 441 may be formed using a thin film of a material represented by the chemical formula, $InMO_3(ZnO)_m$ (m>0). Here, M represents one or more metal elements selected from Ga, Al, Mn, and Co. For example, M can be Ga, Ga and Al, Ga and Mn, Ga and Co, or the like.

In the case where an In—Zn—O-based material is used as the oxide semiconductor, the atomic ratio thereof is In/Zn=0.5 to 50, preferably In/Zn=1 to 20, more preferably In/Zn=1.5 to 15. When the atomic ratio of Zn is in the above preferred range, the field-effect mobility of a transistor can be improved. Here, when the atomic ratio of the compound is In:Zn:O=X:Y:Z, the relation Z>1.5X+Y is satisfied.

In this embodiment, the amorphous oxide semiconductor film 441 is formed by a sputtering method using an In—Ga—Zn—O-based metal oxide target. Further, the amorphous oxide semiconductor film 441 can be formed in a rare gas (typically argon) atmosphere, an oxygen atmosphere, or a mixed atmosphere containing a rare gas and oxygen. The amorphous oxide semiconductor film 441 is preferably formed in an oxygen atmosphere (e.g., oxygen 100%) when made to contain excess oxygen by film formation thereof.

A target used for the formation of the amorphous oxide semiconductor film 441 by a sputtering method is, for example, an oxide target containing $In_2O_3$, $Ga_2O_3$, and ZnO at a composition ratio of 1:1:1 [molar ratio], so that an In—Ga—Zn—O film is formed. Without limitation to the material and the component of the target, it is also possible to use, for example, a metal oxide target containing $In_2O_3$, $Ga_2O_3$, and ZnO at a composition ratio of 1:1:2 [molar ratio].

The filling rate of the metal oxide target is higher than or equal to 90% and lower than or equal to 100%, preferably higher than or equal to 95% and lower than or equal to 99.9%. With use of the metal oxide target with high filling rate, the amorphous oxide semiconductor film 441 can be dense.

As a sputtering gas used for forming the amorphous oxide semiconductor film 441, it is preferable to use a high-purity gas from which an impurity such as hydrogen, water, a hydroxyl group, or hydride is removed.

The substrate is held in a film formation chamber kept under reduced pressure. Then, while moisture remaining in the film formation chamber is removed, a sputtering gas from which hydrogen and moisture are removed is introduced, and the above-described target is used, so that the amorphous oxide semiconductor film 441 is formed over the substrate 400. In order to remove moisture remaining in the film formation chamber, an entrapment vacuum pump such as a cryopump, an ion pump, or a titanium sublimation pump is preferably used. As an exhaustion unit, a turbo molecular pump to which a cold trap is added may be used. In the film formation chamber which is exhausted with the cryopump, a hydrogen atom, a compound containing a hydrogen atom, such as water ($H_2O$), (more preferably, also a compound containing a carbon atom), and the like are removed, whereby the concentration of an impurity in the amorphous oxide semiconductor film 441 formed in the film formation chamber can be reduced.

It is preferable that the gate insulating layer 402 and the amorphous oxide semiconductor film 441 be successively formed in this order without exposure to the air. When the gate insulating layer 402 and the amorphous oxide semiconductor film 441 are successively formed without exposure to the air, impurities such as hydrogen and moisture can be prevented from being adsorbed to the surface of the gate insulating layer 402.

Further, heat treatment may be performed on the amorphous oxide semiconductor film 441 in order to remove excess hydrogen (including water and a hydroxyl group) (to perform dehydration or dehydrogenation). The heat treatment is performed at temperatures at which the amorphous oxide semiconductor film is not crystallized, typically, higher than or equal to 250° C. and lower than or equal to 400° C., preferably lower than or equal to 300° C.

The heat treatment for dehydration or dehydrogenation is preferably performed before the amorphous oxide semiconductor film 441 is processed into an island shape because oxygen contained in the gate insulating layer 402 can be prevented from being released by the heat treatment.

Note that in the heat treatment, it is preferable that water, hydrogen, and the like be not contained in nitrogen or a rare gas such as helium, neon, or argon. The purity of nitrogen or the rare gas such as helium, neon, or argon which is introduced into a heat treatment apparatus is set to preferably 6N (99.9999%) or higher, more preferably 7N (99.99999%) or higher (i.e., the impurity concentration is preferably 1 ppm or lower, more preferably 0.1 ppm or lower).

In addition, after the amorphous oxide semiconductor film 441 is heated by the heat treatment, it is possible to introduce, into the same furnace, a high-purity oxygen gas, a high-purity $N_2O$ gas, or ultra dry air (the moisture amount is 20 ppm or lower (−55° C. by conversion into a dew point), preferably 1 ppm or lower, more preferably 10 ppb or lower, in the measurement using a dew point meter of a cavity ring down laser spectroscopy (CRDS) system). It is preferable that water, hydrogen, and the like be not contained in the oxygen gas or the $N_2O$ gas. The purity of the oxygen gas or the $N_2O$ gas which is introduced into the heat treatment apparatus is preferably 6N or higher, more preferably 7N or higher (i.e., the impurity concentration in the oxygen gas or the $N_2O$ gas is preferably 1 ppm or lower, more preferably 0.1 ppm or lower). The oxygen gas or the $N_2O$ gas acts to supply oxygen that is a main component material of the amorphous oxide semiconductor film and that is reduced by the step for removing an impurity for the dehydration or dehydrogenation, so that the amorphous oxide semiconductor film can be a highly purified, electrically I-type (intrinsic) oxide semiconductor film.

Next, the amorphous oxide semiconductor film 441 is processed into an island-shaped amorphous oxide semiconductor layer 442 by a second photolithography step (see FIG. 1C). Further, a resist mask for forming the island-shaped amorphous oxide semiconductor layer 442 may be formed by an inkjet method. Formation of the resist mask by an inkjet method needs no photomask; thus, manufacturing cost can be reduced.

According to one embodiment of the disclosed invention, the oxide semiconductor layer (amorphous oxide semiconductor layer and crystalline oxide semiconductor layer) may be processed into an island shape as described in this embodiment or may retain a film form without processing the shape.

In the case where a contact hole is formed in the gate insulating layer 402, a step of forming the contact hole can be performed at the same time as processing into the amorphous oxide semiconductor layer 442.

Note that etching of the amorphous oxide semiconductor film 441 performed at this time may be wet etching, dry etching, or both dry etching and wet etching. As an etchant used for wet etching of the amorphous oxide semiconductor film 441, for example, a mixed solution of phosphoric acid, acetic acid, and nitric acid can be used. In addition, ITO07N (produced by KANTO CHEMICAL CO., INC.) may also be used.

Next, a conductive film to be a source electrode layer and a drain electrode layer (including a wiring formed in the same layer as the source electrode layer and the drain electrode layer) is formed over the gate insulating layer 402 and the amorphous oxide semiconductor layer 442. The conductive film is formed using a material that can withstand heat treatment in a later step. As the conductive film used for the source electrode layer and the drain electrode layer, it is possible to use, for example, a metal film containing an element selected from Al, Cr, Cu, Ta, Ti, Mo, and W, a metal nitride film containing any of the above elements as its component (titanium nitride film, molybdenum nitride film, or tungsten nitride film), or the like. A metal film having a high melting point such as Ti, Mo, or W, or a metal nitride film of any of these elements (titanium nitride film, molybdenum nitride film, or tungsten nitride film) may be stacked on one of or both of a lower side or an upper side of a metal film of Al, Cu, or the like. Alternatively, the conductive film used for the source electrode layer and the drain electrode layer may be formed using a conductive metal oxide. As the conductive metal oxide, it is possible to use indium oxide, tin oxide, zinc oxide, indium oxide-tin oxide, indium oxide-zinc oxide, or any of these metal oxide materials containing silicon oxide.

A resist mask is formed over the conductive film by a third photolithography step. Etching is selectively performed, so that the source electrode layer 405a and the drain electrode layer 405b are formed. Then, the resist mask is removed.

In order to reduce the number of photomasks used in a photolithography step and reduce the number of photolithography steps, an etching step may be performed using a multi-tone mask which is a light-exposure mask through which light is transmitted to have a plurality of intensities. A resist mask formed using a multi-tone mask has a plurality of thicknesses and further can be changed in shape by etching; therefore, the resist mask can be used in a plurality of etching steps for processing into different patterns. Therefore, a resist mask corresponding to at least two kinds of different patterns can be formed by one multi-tone mask. Thus, the number of light-exposure masks can be reduced and the number of corresponding photolithography steps can also be reduced, whereby simplification of a process can be achieved.

Note that when the conductive film is etched, the optimum etching condition is desirably made so that the amorphous oxide semiconductor layer 442 can be prevented from being etched together with the conductive film and divided. However, it is difficult to obtain conditions under which only the conductive film is etched and the amorphous oxide semiconductor layer 442 is not etched at all. For that reason, in some cases, only part of the amorphous oxide semiconductor layer 442 is etched to be an oxide semiconductor layer having a groove (depressed portion) at the time when the conductive film is etched.

In this embodiment, a Ti film is used as the conductive film and an In—Ga—Zn—O-based oxide semiconductor is used for the amorphous oxide semiconductor layer 442; thus, an ammonia hydrogen peroxide mixture (mixed solution of ammonia, water, and a hydrogen peroxide solution) is used as an etchant.

Next, an oxide insulating layer 407 is formed in contact with part of the amorphous oxide semiconductor layer 442 (see FIG. 1D). The oxide insulating layer 407 may have a single-layer structure or a layered structure, and includes an aluminum oxide film.

The thickness of the aluminum oxide film included in the oxide insulating layer 407 is greater than or equal to 30 nm and less than or equal to 500 nm, preferably greater than or equal to 50 nm and less than or equal to 200 nm. The oxide insulating layer 407 can be formed by a method by which impurities such as water and hydrogen are not mixed into the oxide insulating layer 407, such as a sputtering method, as appropriate. When hydrogen is contained in the oxide insulating layer 407, hydrogen may possibly enter the oxide semiconductor layer or extracts oxygen in the oxide semiconductor layer, thereby making the resistance of the backchannel of the oxide semiconductor layer low (making the oxide semiconductor layer have an n-type conductivity), so that a parasitic channel might be formed. Therefore, it is important to employ a film formation method in which hydrogen is not used so that the oxide insulating layer 407 does not contain hydrogen as much as possible.

The aluminum oxide film preferably includes a region containing excess oxygen as compared to a stoichiometric composition ratio of crystalline aluminum oxide. In that case, the oxygen content is higher than that in a stoichiometric composition ratio of aluminum oxide. Alternatively, the oxygen content is higher than that in single crystal aluminum oxide. In some cases, oxygen may exist between lattices of aluminum oxide. In the case where the composition is represented by $AlO_x$ (x>0), since the stoichiometric composition ratio of aluminum oxide is Al:O=3:2, it is preferable to use an aluminum oxide film which includes an oxygen excess region with a composition where x is greater than $3/2$. Such an oxygen excess region may exist in part (including an interface) of the aluminum oxide film.

In this embodiment, an aluminum oxide film with a thickness of 100 nm is formed as the oxide insulating layer 407 by a sputtering method. The formation of the aluminum oxide film by a sputtering method can be performed in a rare gas (typically argon) atmosphere, an oxygen atmosphere, or a mixed atmosphere containing a rare gas and oxygen.

In order to remove moisture remaining in a film formation chamber of the oxide insulating layer 407, in a manner similar to that in the formation of the amorphous oxide semiconductor film 441, an entrapment vacuum pump (such as a cryopump) is preferably used. The concentration of an impurity contained in the oxide insulating layer 407 which is formed in the film formation chamber exhausted using a cryopump can be reduced. As an exhaustion unit for removing moisture remaining in the film formation chamber of the oxide insulating layer 407, a turbo molecular pump provided with a cold trap may also be used.

A high-purity gas from which impurities such as hydrogen, water, a hydroxyl group, and hydride are removed is preferably used as a sputtering gas used in the formation of the oxide insulating layer 407.

The oxide insulating layer 407 can have a layered structure including the aluminum oxide film and an inorganic insulating film such as, typically, a silicon oxide film, a silicon oxynitride film, an aluminum oxynitride film, or a gallium oxide film. FIGS. 12A to 12E illustrate an example in which the oxide insulating layer 407 has a layered structure including oxide insulating layers 407a and 407b.

Figure 12A:
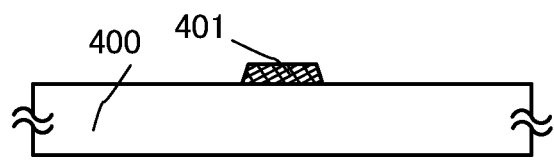
FIGS. 12A to 12E illustrate one embodiment of a semiconductor device and a method of manufacturing the semiconductor device.
Figure 12B:
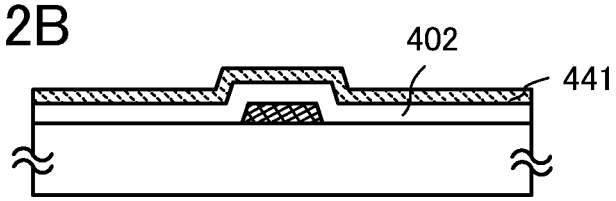
Figure 12C:
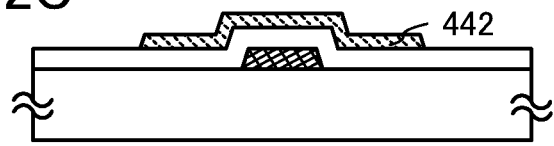
Figure 12D:
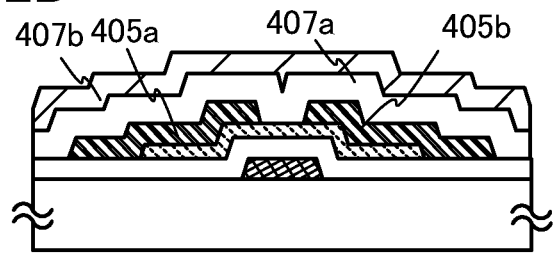
Figure 12E:
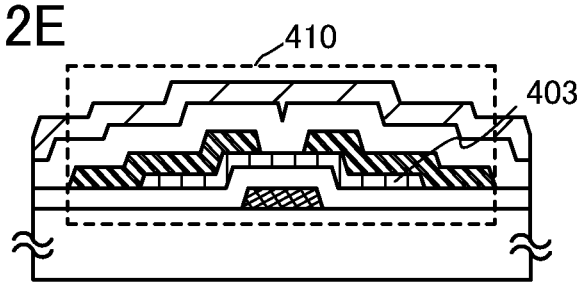

As illustrated in FIG. 12D, the oxide insulating layer 407a is formed over the amorphous oxide semiconductor layer 442, the source electrode layer 405a, and the drain electrode layer 405b, and the oxide insulating layer 407b is formed over the oxide insulating layer 407a. The oxide insulating layer 407a is preferably formed using an oxide insulating layer which includes a region containing a large amount of oxygen so that oxygen can be supplied therefrom to the amorphous oxide semiconductor layer 442. For example, in this embodiment, the oxide insulating layer 407a is formed using a silicon oxide film which includes a region containing excess oxygen as compared to a stoichiometric composition ratio of crystalline silicon oxide, and the oxide insulating layer 407b is formed using an aluminum oxide film.

Next, heat treatment is performed on the amorphous oxide semiconductor layer 442 so that at least part of the amorphous oxide semiconductor layer 442 is crystallized and the crystalline oxide semiconductor layer 403 which includes a crystal having a c-axis substantially perpendicular to the surface of the crystalline oxide semiconductor layer 403 is formed.

The aluminum oxide film provided as the oxide insulating layer 407 over the amorphous oxide semiconductor layer 442 has a high shielding effect (blocking effect) and thus is less likely to transmit both oxygen and impurities such as hydrogen and moisture.

Accordingly, the aluminum oxide film serves as a protection film that prevents entry of impurities such as hydrogen and moisture, which cause variation in the electric characteristics of a transistor, into the oxide semiconductor layer (the amorphous oxide semiconductor layer 442 and the crystalline oxide semiconductor layer 403) and release of oxygen, which is a main component material of the oxide semiconductor, from the oxide semiconductor layer (the amorphous oxide semiconductor layer 442 and the crystalline oxide semiconductor layer 403) during and after the manufacturing process.

The heat treatment for crystallizing the amorphous oxide semiconductor layer 442 is performed in a state where the amorphous oxide semiconductor layer 442 is interposed between the silicon oxide film formed as the gate insulating layer 402 and the aluminum oxide film formed as the oxide insulating layer 407; therefore, oxygen can be prevented from being released from the amorphous oxide semiconductor layer 442 by the heat treatment for crystallization. Thus, the crystalline oxide semiconductor layer 403 obtained in this manner can maintain the amount of oxygen which has been contained in the amorphous oxide semiconductor layer 442, and include a region containing excess oxygen as compared to a stoichiometric composition ratio of an oxide semiconductor in a crystalline state.

Therefore, the crystalline oxide semiconductor layer 403 formed has high purity because impurities such as hydrogen and moisture are not mixed therein, and includes the region containing excess oxygen as compared to a stoichiometric composition ratio of an oxide semiconductor in a crystalline state because oxygen is prevented from being released. Accordingly, by using the crystalline oxide semiconductor layer 403 for the transistor 410, it is possible to reduce variation in the threshold voltage ($V_{th}$) of the transistor due to an oxygen vacancy and a shift of the threshold voltage ($\Delta V_{th}$).

The heat treatment for crystallizing at least part of the amorphous oxide semiconductor layer 442 is performed at temperatures higher than or equal to 250° C. and lower than or equal to 700° C., preferably higher than or equal to 400° C., more preferably higher than or equal to 500° C., even more preferably higher than or equal to 550° C.

For example, the substrate is put in an electric furnace which is a type of a heat treatment apparatus, and the oxide semiconductor layer is subjected to heat treatment at 450° C. for one hour under reduced pressure.

Note that the heat treatment apparatus is not limited to an electric furnace, and a device for heating a process object by heat conduction or heat radiation from a heating element such as a resistance heater may alternatively be used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating the process object by radiation of light (electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with the process object by heat treatment, such as nitrogen or a rare gas like argon, is used.

For example, as the heat treatment, GRTA may be performed as follows. The substrate is put in an inert gas heated at high temperatures of 650° C. to 700° C., is heated for several minutes, and is taken out of the inert gas.

The heat treatment may be performed under an atmosphere containing nitrogen, oxygen, ultra-dry air (air in which a water content is 20 ppm or lower, preferably 1 ppm or lower, more preferably 10 ppb or lower), or a rare gas (argon, helium, or the like). Note that it is preferable that water, hydrogen, and the like be not contained in the atmosphere containing nitrogen, oxygen, ultra-dry air, or a rare gas. It is also preferable that the purity of nitrogen, oxygen, or the rare gas which is introduced into a heat treatment apparatus be set to 6N (99.9999%) or higher, preferably 7N (99.99999%) or higher (that is, the impurity concentration is 1 ppm or lower, preferably 0.1 ppm or lower).

The number of carriers in the highly purified crystalline oxide semiconductor layer 403 is very small (close to zero), and the carrier concentration is lower than $1 \times 10^{14}/cm^3$, preferably lower than $1 \times 10^{12}/cm^3$, more preferably lower than $1 \times 10^{11}/cm^3$.

Through the above steps, the transistor 410 is formed (see FIG. 1E). The transistor 410 includes the highly purified crystalline oxide semiconductor layer containing excess oxygen that compensates an oxygen vacancy. Therefore, the transistor 410 has less variation in electric characteristics and is electrically stable.

In the transistor 410 using the highly purified crystalline oxide semiconductor layer 403 containing excess oxygen that compensates an oxygen vacancy, the current in an off state (off-state current value) per micrometer in channel width can be reduced to less than 10 zA/μm at room temperature and less than 100 zA/μm at 85° C.

As described above, a semiconductor device which includes an oxide semiconductor and has stable electric characteristics can be provided. Therefore, a highly reliable semiconductor device can be provided.

Embodiment 2

This embodiment shows another embodiment of a semiconductor device and a method of manufacturing the semiconductor device with reference to FIGS. 2A to 2E. The same portions as the above embodiment or portions having functions similar to those of the above embodiment can be formed in a manner similar to that of the above embodiment; therefore, repetitive description thereof is omitted. In addition, detailed description of the same portions is not repeated.

A transistor 440 illustrated in FIGS. 2A to 2E is an example of a top-gate transistor.

Figure 2A:
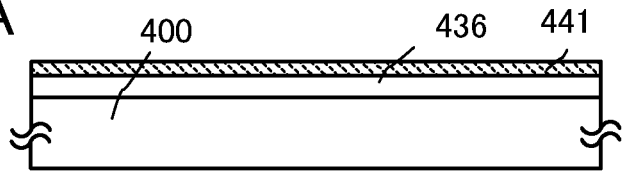
FIGS. 2A to 2E illustrate one embodiment of a semiconductor device and a method of manufacturing the semiconductor device.
Figure 2B:
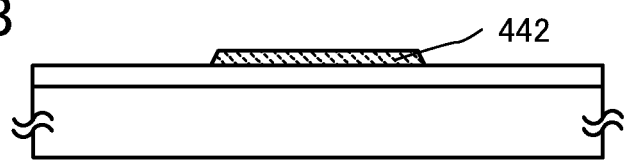
Figure 2C:
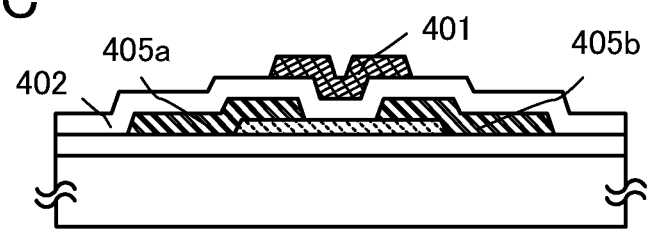
Figure 2D:
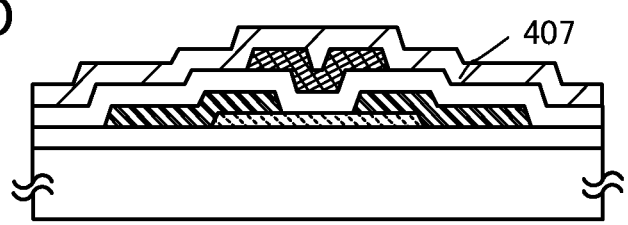
Figure 2E:
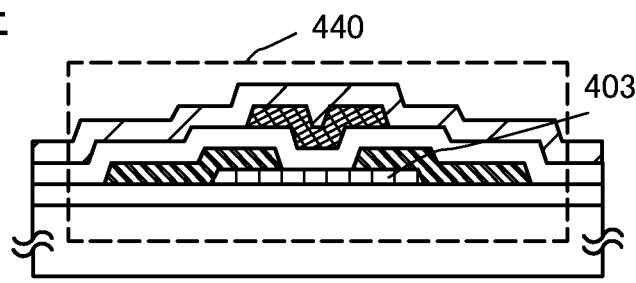

As shown in FIG. 2E, the transistor 440 includes the crystalline oxide semiconductor layer 403, the source electrode layer 405a, the drain electrode layer 405b, the gate insulating layer 402, and the gate electrode layer 401 which are formed over the substrate 400 having an insulating surface provided with an insulating layer 436. The oxide insulating layer 407 is formed over the transistor 440.

FIGS. 2A to 2E illustrate an example of a method of manufacturing the transistor 440.

First, the insulating layer 436 is formed over the substrate 400 having an insulating surface. The insulating layer 436 may have a single-layer structure or a layered structure, and a film to be in contact with the crystalline oxide semiconductor layer 403 is formed using a silicon oxide film.

The silicon oxide film in contact with the crystalline oxide semiconductor layer 403 preferably includes a region containing excess oxygen as compared to a stoichiometric composition ratio of crystalline silicon oxide. In that case, the oxygen content is higher than that in a stoichiometric composition ratio of silicon oxide. Alternatively, the oxygen content is higher than that in single crystal silicon oxide. In some cases, oxygen may exist between lattices of silicon oxide. In the case of a silicon oxide film whose composition is represented by $SiO_x$ (x>0), since the stoichiometric composition ratio of silicon oxide is Si:O=1:2, it is preferable to use a silicon oxide film which includes an oxygen excess region with a composition where x is greater than 2. Such an oxygen excess region may exist in part (including an interface) of the silicon oxide film.

The silicon oxide film in contact with the crystalline oxide semiconductor layer 403 contains a large amount of oxygen so as to suitably serve as a source of oxygen to be supplied to the oxide semiconductor layer.

When the insulating layer 436 has a layered structure, film(s) other than the film(s) to be in contact with the crystalline oxide semiconductor layer 403 can be formed using one or more of silicon nitride, silicon oxynitride, silicon nitride oxide, aluminum oxide, aluminum nitride, aluminum oxynitride, aluminum nitride oxide, hafnium oxide, and gallium oxide, by a plasma CVD method, a sputtering method, or the like.

Next, the amorphous oxide semiconductor film 441 is formed over the insulating layer 436 (see FIG. 2A).

The amorphous oxide semiconductor film 441 includes a region containing excess oxygen as compared to a stoichiometric composition ratio of an oxide semiconductor in a crystalline state. In that case, the oxygen content is higher than that in a stoichiometric composition ratio of an oxide semiconductor. Alternatively, the oxygen content is higher than that in the oxide semiconductor in a single crystal state. In some cases, oxygen may exist between lattices of the oxide semiconductor. In this embodiment, an In—Ga—Zn—O-based oxide semiconductor film is formed using an In—Ga—Zn—O-based metal oxide target by a sputtering method.

It is preferable that the insulating layer 436 and the amorphous oxide semiconductor film 441 be successively formed in this order without exposure to the air. When the insulating layer 436 and the amorphous oxide semiconductor film 441 are successively formed without exposure to the air, impurities such as hydrogen and moisture can be prevented from being adsorbed to the surface of the insulating layer 436.

Further, heat treatment may be performed on the amorphous oxide semiconductor film 441 in order to remove excess hydrogen (including water and a hydroxyl group) (to perform dehydration or dehydrogenation). The heat treatment is performed at temperatures at which the amorphous oxide semiconductor film is not crystallized, typically, higher than or equal to 250° C. and lower than or equal to 400° C., preferably lower than or equal to 300° C.

The heat treatment for dehydration or dehydrogenation is preferably performed before the amorphous oxide semiconductor film 441 is processed into an island shape because oxygen contained in the insulating layer 436 can be prevented from being released by the heat treatment.

Next, the amorphous oxide semiconductor film 441 is processed into the island-shaped amorphous oxide semiconductor layer 442 by a photolithography step (see FIG. 2B).

The source electrode layer 405a and the drain electrode layer 405b are formed over the insulating layer 436 and the amorphous oxide semiconductor layer 442. Then, the gate insulating layer 402 is formed over the insulating layer 436, the amorphous oxide semiconductor layer 442, the source electrode layer 405a, and the drain electrode layer 405b. The gate insulating layer 402 is formed using an oxide insulating layer formed by a sputtering method or a plasma CVD method. In this embodiment, the gate insulating layer 402 is formed using a silicon oxynitride film formed by a plasma CVD method.

Next, the gate electrode layer 401 is formed so as to overlap with the amorphous oxide semiconductor layer 442 over the gate insulating layer 402 (see FIG. 2C).

Next, the oxide insulating layer 407 is formed over the gate electrode layer 401 (see FIG. 2D). The oxide insulating layer 407 may have a single-layer structure or a layered structure, and includes an aluminum oxide film.

The thickness of the aluminum oxide film included in the oxide insulating layer 407 is greater than or equal to 30 nm and less than or equal to 500 nm, preferably greater than or equal to 50 nm and less than or equal to 200 nm.

The aluminum oxide film preferably includes a region containing excess oxygen as compared to a stoichiometric composition ratio of crystalline aluminum oxide. In that case, the oxygen content is higher than that in a stoichiometric composition ratio of aluminum oxide. Alternatively, the oxygen content is higher than that in single crystal aluminum oxide. In some cases, oxygen may exist between lattices of aluminum oxide. In the case where the composition is represented by $AlO_x$ (x>0), since the stoichiometric composition ratio of aluminum oxide is Al:O=3:2, it is preferable to use an aluminum oxide film which includes an oxygen excess region with a composition where x is greater than 3/2. Such an oxygen excess region may exist in part (including an interface) of the aluminum oxide film.

In this embodiment, the oxide insulating layer 407 is formed using an aluminum oxide film with a thickness of 100 nm formed by a sputtering method.

Next, heat treatment is performed on the amorphous oxide semiconductor layer 442 so that at least part of the amorphous oxide semiconductor layer 442 is crystallized and the crystalline oxide semiconductor layer 403 which includes a crystal having a c-axis substantially perpendicular to the surface of the crystalline oxide semiconductor layer 403 is formed.

The aluminum oxide film provided as the oxide insulating layer 407 over the amorphous oxide semiconductor layer 442 has a high shielding effect (blocking effect) and thus is less likely to transmit both oxygen and impurities such as hydrogen and moisture.

Accordingly, the aluminum oxide film serves as a protection film that prevents entry of impurities such as hydrogen and moisture, which cause variation in the electric characteristics of a transistor, into the oxide semiconductor layer (the amorphous oxide semiconductor layer 442 and the crystalline oxide semiconductor layer 403) and release of oxygen, which is a main component material of the oxide semiconductor, from the oxide semiconductor layer (the amorphous oxide semiconductor layer 442 and the crystalline oxide semiconductor layer 403) during and after the manufacturing process.

The heat treatment for crystallizing the amorphous oxide semiconductor layer 442 is performed in a state where the amorphous oxide semiconductor layer 442 is interposed between the silicon oxide film formed as the insulating layer 436 and the aluminum oxide film formed as the oxide insulating layer 407; therefore, oxygen can be prevented from being released from the amorphous oxide semiconductor layer 442 by the heat treatment for crystallization. Accordingly, the crystalline oxide semiconductor layer 403 obtained in this manner can maintain the amount of oxygen which has been contained in the amorphous oxide semiconductor layer 442, and include a region containing excess oxygen as compared to a stoichiometric composition ratio of an oxide semiconductor in a crystalline state.

Therefore, the crystalline oxide semiconductor layer 403 formed has high purity because impurities such as hydrogen and moisture are not mixed therein, and includes the region containing excess oxygen as compared to a stoichiometric composition ratio of an oxide semiconductor in a crystalline state because oxygen is prevented from being released. Accordingly, by using the crystalline oxide semiconductor layer 403 for the transistor 440, it is possible to reduce variation in the threshold voltage ($V_{th}$) of the transistor due to an oxygen vacancy and a shift of the threshold voltage ($\Delta V_{th}$).

The heat treatment for crystallizing at least part of the amorphous oxide semiconductor layer 442 is performed at temperatures higher than or equal to 250° C. and lower than or equal to 700° C., preferably higher than or equal to 400° C., more preferably higher than or equal to 500° C., even more preferably higher than or equal to 550° C.

Through the above process, the transistor 440 is formed (see FIG. 2E). The transistor 440 includes the highly purified crystalline oxide semiconductor layer 403 containing excess oxygen that compensates an oxygen vacancy. Therefore, the transistor 440 has less variation in electric characteristics and is electrically stable.

As described above, a semiconductor device which includes an oxide semiconductor and has stable electric characteristics can be provided. Therefore, a highly reliable semiconductor device can be provided.

This embodiment can be combined with any of the other embodiments as appropriate.

Embodiment 3

This embodiment shows another embodiment of a semiconductor device and a method of manufacturing the semiconductor device with reference to FIGS. 3A to 3E. The same portions as the above embodiment or portions having functions similar to those of the above embodiment can be formed in a manner similar to that of the above embodiment; therefore, repetitive description thereof is omitted. In addition, detailed description of the same portions is not repeated.

A transistor 430 illustrated in FIGS. 3A to 3E is an example of a bottom-gate transistor.

The transistor 430 includes the gate electrode layer 401, the gate insulating layer 402, the source electrode layer 405a, the drain electrode layer 405b, and the crystalline oxide semiconductor layer 403, which are formed over the substrate 400 having an insulating surface. The oxide insulating layer 407 is formed so as to cover the transistor 430.

FIGS. 3A to 3E illustrate an example of a method of manufacturing the transistor 430.

Figure 3A:
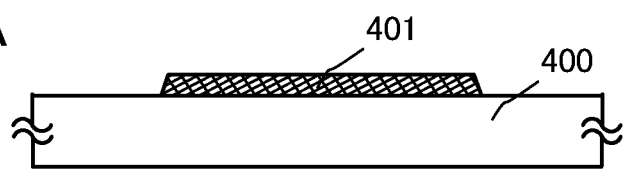
FIGS. 3A to 3E illustrate one embodiment of a semiconductor device and a method of manufacturing the semiconductor device.

First, the gate electrode layer 401 is formed over the substrate 400 having an insulating surface (see FIG. 3A).

The gate insulating layer 402 is formed over the gate electrode layer 401. The gate insulating layer 402 may have a single-layer structure or a layered structure, and a film to be in contact with the crystalline oxide semiconductor layer 403 is formed using a silicon oxide film.

The silicon oxide film in contact with the crystalline oxide semiconductor layer 403 preferably includes a region containing excess oxygen as compared to a stoichiometric composition ratio of crystalline silicon oxide. In that case, the oxygen content is higher than that in a stoichiometric composition ratio of silicon oxide. Alternatively, the oxygen content is higher than that in single crystal silicon oxide. In some cases, oxygen may exist between lattices of silicon oxide. In the case of a silicon oxide film whose composition is represented by $SiO_x$ ($x>0$), since the stoichiometric composition ratio of silicon oxide is $Si:O=1:2$, it is preferable to use a silicon oxide film which includes an oxygen excess region with a composition where x is greater than 2. Such an oxygen excess region may exist in part (including an interface) of the silicon oxide film.

The silicon oxide film in contact with the crystalline oxide semiconductor layer 403 contains a large amount of oxygen so as to suitably serve as a source of oxygen to be supplied to the oxide semiconductor layer.

Figure 3B:
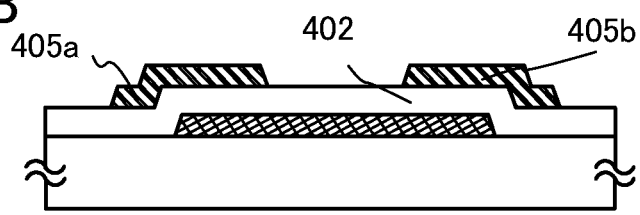

Next, the source electrode layer 405a and the drain electrode layer 405b are formed over the gate insulating layer 402 (see FIG. 3B).

Figure 3C:
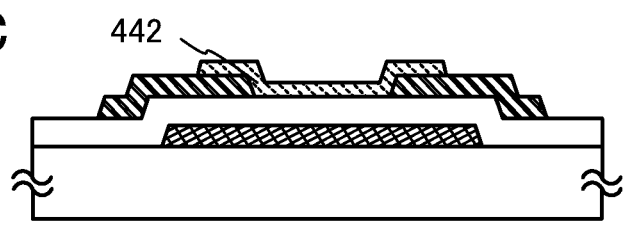

Then, an amorphous oxide semiconductor film is formed over the gate insulating layer 402, the source electrode layer 405a, and the drain electrode layer 405b, and the amorphous oxide semiconductor film is processed into an island shape to form the amorphous oxide semiconductor layer 442 (see FIG. 3C).

The amorphous oxide semiconductor layer 442 includes a region containing excess oxygen as compared to a stoichiometric composition ratio of an oxide semiconductor in a crystalline state. In that case, the oxygen content is higher than that in a stoichiometric composition ratio of an oxide semiconductor. Alternatively, the oxygen content is higher than that in the oxide semiconductor in a single crystal state. In some cases, oxygen may exist between lattices of the oxide semiconductor. In this embodiment, an In—Ga—Zn—O-based oxide semiconductor film is formed using an In—Ga—Zn—O-based metal oxide target by a sputtering method.

Further, heat treatment may be performed on the amorphous oxide semiconductor layer 442 in order to remove excess hydrogen (including water and a hydroxyl group) (to perform dehydration or dehydrogenation). The heat treatment is performed at temperatures at which the amorphous oxide semiconductor layer 442 is not crystallized, typically, higher than or equal to 250° C. and lower than or equal to 400° C., preferably lower than or equal to 300° C.

The heat treatment for dehydration or dehydrogenation may be performed before processing into the island-shaped amorphous oxide semiconductor layer 442.

Figure 3D:
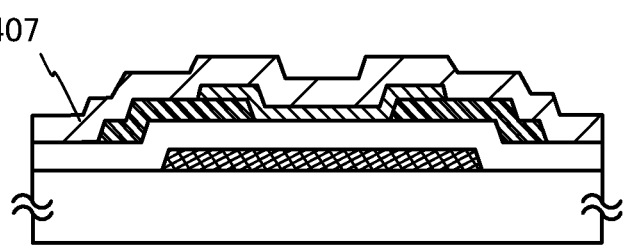

Next, the oxide insulating layer 407 is formed over the amorphous oxide semiconductor layer 442 (see FIG. 3D). The oxide insulating layer 407 may have a single-layer structure or a layered structure, and includes an aluminum oxide film.

The thickness of the aluminum oxide film included in the oxide insulating layer 407 is greater than or equal to 30 nm and less than or equal to 500 nm, preferably greater than or equal to 50 nm and less than or equal to 200 nm.

The aluminum oxide film preferably includes a region containing excess oxygen as compared to a stoichiometric composition ratio of crystalline aluminum oxide. In that case, the oxygen content is higher than that in a stoichiometric composition ratio of aluminum oxide. Alternatively, the oxygen content is higher than that in single crystal aluminum oxide. In some cases, oxygen may exist between lattices of aluminum oxide. In the case where the composition is represented by $AlO_x$ (x>0), since the stoichiometric composition ratio of aluminum oxide is Al:O=3:2, it is preferable to use an aluminum oxide film which includes an oxygen excess region with a composition where x is greater than 3/2. Such an oxygen excess region may exist in part (including an interface) of the aluminum oxide film.

In this embodiment, the oxide insulating layer 407 is formed using an aluminum oxide film with a thickness of 100 nm formed by a sputtering method.

Next, heat treatment is performed on the amorphous oxide semiconductor layer 442 so that at least part of the amorphous oxide semiconductor layer 442 is crystallized and the crystalline oxide semiconductor layer 403 which includes a crystal having a c-axis substantially perpendicular to the surface of the crystalline oxide semiconductor layer 403 is formed.

The aluminum oxide film provided as the oxide insulating layer 407 over the amorphous oxide semiconductor layer 442 has a high shielding effect (blocking effect) and thus is less likely to transmit both oxygen and impurities such as hydrogen and moisture.

Accordingly, the aluminum oxide film serves as a protection film that prevents entry of impurities such as hydrogen and moisture, which cause variation in the electric characteristics of a transistor, into the oxide semiconductor layer (the amorphous oxide semiconductor layer 442 and the crystalline oxide semiconductor layer 403) and release of oxygen, which is a main component material of the oxide semiconductor, from the oxide semiconductor layer (the amorphous oxide semiconductor layer 442 and the crystalline oxide semiconductor layer 403) during and after the manufacturing process.

The heat treatment for crystallizing the amorphous oxide semiconductor layer 442 is performed in a state where the amorphous oxide semiconductor layer 442 is interposed between the silicon oxide film formed as the gate insulating layer 402 and the aluminum oxide film formed as the oxide insulating layer 407; therefore, oxygen can be prevented from being released from the amorphous oxide semiconductor layer 442 by the heat treatment for crystallization. Accordingly, the crystalline oxide semiconductor layer 403 obtained in this manner can maintain the amount of oxygen which has been contained in the amorphous oxide semiconductor layer 442, and include a region containing excess oxygen as compared to a stoichiometric composition ratio of an oxide semiconductor in a crystalline state.

Therefore, the crystalline oxide semiconductor layer 403 formed has high purity because impurities such as hydrogen and moisture are not mixed therein, and includes the region containing excess oxygen as compared to a stoichiometric composition ratio of an oxide semiconductor in a crystalline state because oxygen is prevented from being released. Accordingly, by using the crystalline oxide semiconductor layer 403 for the transistor 430, it is possible to reduce variation in the threshold voltage ($V_{th}$) of the transistor due to an oxygen vacancy and a shift of the threshold voltage ($\Delta V_{th}$).

The heat treatment for crystallizing at least part of the amorphous oxide semiconductor layer 442 is performed at temperatures higher than or equal to 250° C. and lower than or equal to 700° C., preferably higher than or equal to 400° C., more preferably higher than or equal to 500° C., even more preferably higher than or equal to 550° C.

Figure 3E:
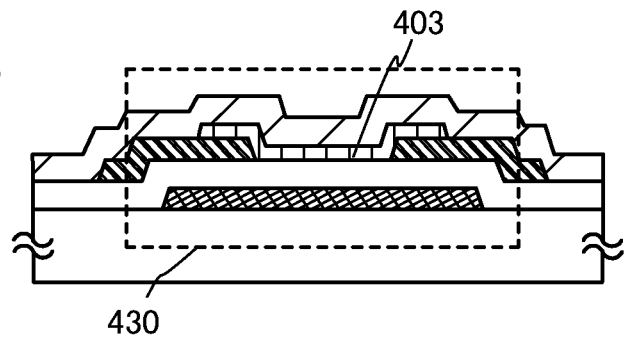

Through the above process, the transistor 430 is formed (see FIG. 3E). The transistor 430 includes the highly purified crystalline oxide semiconductor layer 403 containing excess oxygen that compensates an oxygen vacancy. Therefore, the transistor 430 has less variation in electric characteristics and is electrically stable.

As described above, a semiconductor device which includes an oxide semiconductor and has stable electric characteristics can be provided. Therefore, a highly reliable semiconductor device can be provided.

This embodiment can be combined with any of the other embodiments as appropriate.

Embodiment 4

This embodiment shows another embodiment of a semiconductor device and a method of manufacturing the semiconductor device with reference to FIGS. 4A to 4E. The same portions as the above embodiment or portions having functions similar to those of the above embodiment can be formed in a manner similar to that of the above embodiment; therefore, repetitive description thereof is omitted. In addition, detailed description of the same portions is not repeated.

A transistor 450 illustrated in FIGS. 4A to 4E is an example of a top-gate transistor.

Figure 4A:
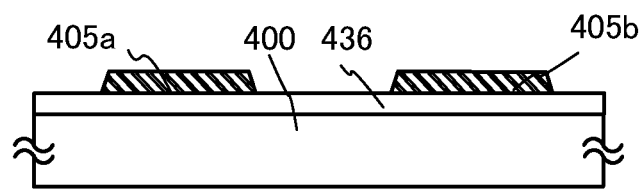
FIGS. 4A to 4E illustrate one embodiment of a semiconductor device and a method of manufacturing the semiconductor device.
Figure 4B:
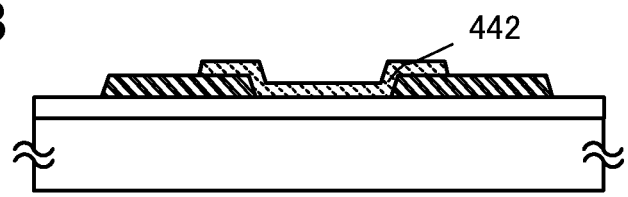
Figure 4C:
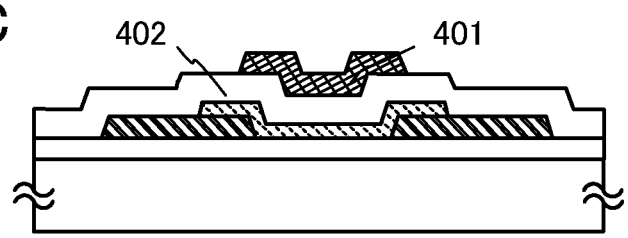
Figure 4D:
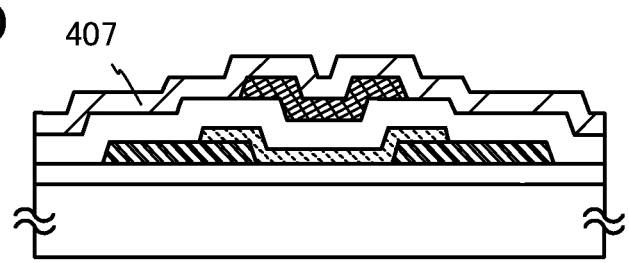
Figure 4E:
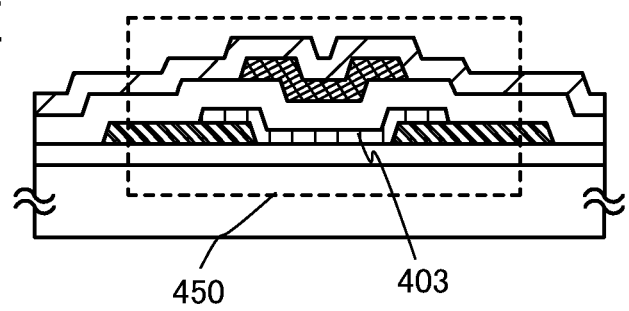

As shown in FIG. 4E, the transistor 450 includes the source electrode layer 405a, the drain electrode layer 405b, the crystalline oxide semiconductor layer 403, the gate insulating layer 402, and the gate electrode layer 401 which are formed over the substrate 400 having an insulating surface provided with an insulating layer 436. The oxide insulating layer 407 is formed over the transistor 450.

FIGS. 4A to 4E illustrate an example of a method of manufacturing the transistor 450.

First, the insulating layer 436 is formed over the substrate 400 having an insulating surface. The insulating layer 436 may have a single-layer structure or a layered structure, and a film to be in contact with the crystalline oxide semiconductor layer 403 is formed using a silicon oxide film.

The silicon oxide film in contact with the crystalline oxide semiconductor layer 403 preferably includes a region containing excess oxygen as compared to a stoichiometric composition ratio of crystalline silicon oxide. In that case, the oxygen content is higher than that in a stoichiometric composition ratio of silicon oxide. Alternatively, the oxygen content is higher than that in single crystal silicon oxide. In some cases, oxygen may exist between lattices of silicon oxide. In the case of a silicon oxide film whose composition is represented by $SiO_x$ (x>0), since the stoichiometric composition ratio of silicon oxide is Si:O=1:2, it is preferable to use a silicon oxide film which includes an oxygen excess region with a composition where x is greater than 2. Such an oxygen excess region may exist in part (including an interface) of the silicon oxide film.

The silicon oxide film in contact with the crystalline oxide semiconductor layer 403 contains a large amount of oxygen so as to suitably serve as a source of oxygen to be supplied to the oxide semiconductor layer.

When the insulating layer 436 has a layered structure, film(s) other than the film(s) to be in contact with the crystalline oxide semiconductor layer 403 can be formed using one or more of silicon nitride, silicon oxynitride, silicon nitride oxide, aluminum oxide, aluminum nitride, aluminum oxynitride, aluminum nitride oxide, hafnium oxide, and gallium oxide, by a plasma CVD method, a sputtering method, or the like.

Next, the source electrode layer 405a and the drain electrode layer 405b are formed over the insulating layer 436 (see FIG. 4A).

Then, an amorphous oxide semiconductor film is formed over the insulating layer 436, the source electrode layer 405a, and the drain electrode layer 405b, and the amorphous oxide semiconductor film is processed into an island shape to form the amorphous oxide semiconductor layer 442 (see FIG. 4B).

The amorphous oxide semiconductor layer 442 includes a region containing excess oxygen as compared to a stoichiometric composition ratio of an oxide semiconductor in a crystalline state. In that case, the oxygen content is higher than that in a stoichiometric composition ratio of an oxide semiconductor. Alternatively, the oxygen content is higher than that in the oxide semiconductor in a single crystal state. In some cases, oxygen may exist between lattices of the oxide semiconductor. In this embodiment, an In—Ga—Zn—O-based oxide semiconductor film is formed using an In—Ga—Zn—O-based metal oxide target by a sputtering method.

Further, heat treatment may be performed on the amorphous oxide semiconductor layer 442 in order to remove excess hydrogen (including water and a hydroxyl group) (to perform dehydration or dehydrogenation). The heat treatment is performed at temperatures at which the amorphous oxide semiconductor layer 442 is not crystallized, typically, higher than or equal to 250° C. and lower than or equal to 400° C., preferably lower than or equal to 300° C.

The heat treatment for dehydration or dehydrogenation may be performed before processing into the island-shaped amorphous oxide semiconductor layer 442.

Next, the gate insulating layer 402 is formed over the insulating layer 436, the source electrode layer 405a, the drain electrode layer 405b, and the amorphous oxide semiconductor layer 442. The gate insulating layer 402 is formed using an oxide insulating layer formed by a sputtering method or a plasma CVD method. In this embodiment, the gate insulating layer 402 is formed using a silicon oxynitride film formed by a plasma CVD method.

Next, the gate electrode layer 401 is formed so as to overlap with the amorphous oxide semiconductor layer 442 over the gate insulating layer 402 (see FIG. 4C).

Next, the oxide insulating layer 407 is formed over the gate electrode layer 401 (see FIG. 4D). The oxide insulating layer 407 may have a single-layer structure or a layered structure, and includes an aluminum oxide film.

The thickness of the aluminum oxide film included in the oxide insulating layer 407 is greater than or equal to 30 nm and less than or equal to 500 nm, preferably greater than or equal to 50 nm and less than or equal to 200 nm.

The aluminum oxide film preferably includes a region containing excess oxygen as compared to a stoichiometric composition ratio of crystalline aluminum oxide. In that case, the oxygen content is higher than that in a stoichiometric composition ratio of aluminum oxide. Alternatively, the oxygen content is higher than that in single crystal aluminum oxide. In some cases, oxygen may exist between lattices of aluminum oxide. In the case where the composition is represented by $AlO_x$ (x>0), since the stoichiometric composition ratio of aluminum oxide is Al:O=3:2, it is preferable to use an aluminum oxide film which includes an oxygen excess region with a composition where x is greater than 3/2. Such an oxygen excess region may exist in part (including an interface) of the aluminum oxide film.

In this embodiment, the oxide insulating layer 407 is formed using an aluminum oxide film with a thickness of 100 nm formed by a sputtering method.

Next, heat treatment is performed on the amorphous oxide semiconductor layer 442 so that at least part of the amorphous oxide semiconductor layer 442 is crystallized and the crystalline oxide semiconductor layer 403 which includes a crystal having a c-axis substantially perpendicular to the surface of the crystalline oxide semiconductor layer 403 is formed.

The aluminum oxide film provided as the oxide insulating layer 407 over the amorphous oxide semiconductor layer 442 has a high shielding effect (blocking effect) and thus is less likely to transmit both oxygen and impurities such as hydrogen and moisture.

Accordingly, the aluminum oxide film serves as a protection film that prevents entry of impurities such as hydrogen and moisture, which cause variation in the electric characteristics of a transistor, into the oxide semiconductor layer (the amorphous oxide semiconductor layer 442 and the crystalline oxide semiconductor layer 403) and release of oxygen, which is a main component material of the oxide semiconductor, from the oxide semiconductor layer (the amorphous oxide semiconductor layer 442 and the crystalline oxide semiconductor layer 403) during and after the manufacturing process.

The heat treatment for crystallizing the amorphous oxide semiconductor layer 442 is performed in a state where the amorphous oxide semiconductor layer 442 is interposed between the silicon oxide film formed as the insulating layer 436 and the aluminum oxide film formed as the oxide insulating layer 407; therefore, oxygen can be prevented from being released from the amorphous oxide semiconductor layer 442 by the heat treatment for crystallization. Accordingly, the crystalline oxide semiconductor layer 403 obtained in this manner can maintain the amount of oxygen which has been contained in the amorphous oxide semiconductor layer 442, and include a region containing excess oxygen as compared to a stoichiometric composition ratio of an oxide semiconductor in a crystalline state.

Therefore, the crystalline oxide semiconductor layer 403 formed has high purity because impurities such as hydrogen and moisture are not mixed therein, and includes the region containing excess oxygen as compared to a stoichiometric composition ratio of an oxide semiconductor in a crystalline state because oxygen is prevented from being released. Accordingly, by using the crystalline oxide semiconductor layer 403 for the transistor 450, it is possible to reduce variation in the threshold voltage ($V_{th}$) of the transistor due to an oxygen vacancy and a shift of the threshold voltage ($\Delta V_{th}$).

The heat treatment for crystallizing at least part of the amorphous oxide semiconductor layer 442 is performed at temperatures higher than or equal to 250° C. and lower than or equal to 700° C., preferably higher than or equal to 400° C., more preferably higher than or equal to 500° C., even more preferably higher than or equal to 550° C.

Through the above process, the transistor 450 is formed (see FIG. 4E). The transistor 450 includes the highly purified crystalline oxide semiconductor layer 403 containing excess oxygen that compensates an oxygen vacancy. Therefore, the transistor 450 has less variation in electric characteristics and is electrically stable.

As described above, a semiconductor device which includes an oxide semiconductor and has stable electric characteristics can be provided. Therefore, a highly reliable semiconductor device can be provided.

This embodiment can be combined with any of the other embodiments as appropriate.

Embodiment 5

A semiconductor device (also referred to as a display device) with a display function can be manufactured using the transistor an example of which is described in any of Embodiments 1 to 4. Moreover, some or all of the driver circuits which include the transistor can be formed over a substrate where the pixel portion is formed, whereby a system-on-panel can be obtained.

Figure 6A:
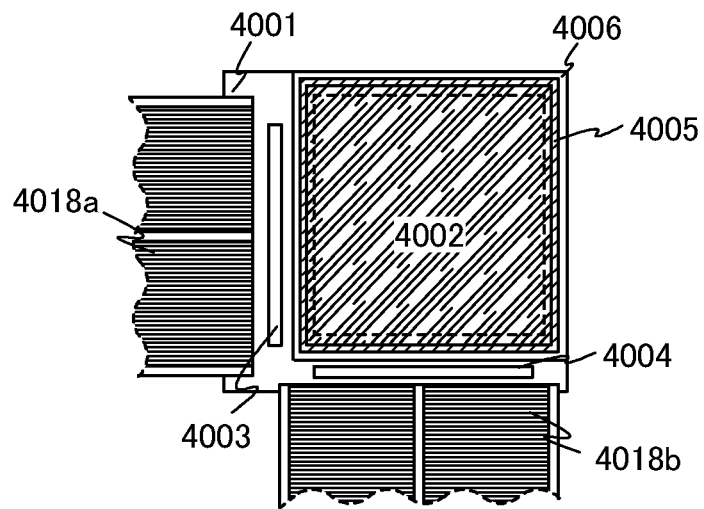
FIGS. 6A to 6C each illustrate one embodiment of a semiconductor device.

In FIG. 6A, a sealant 4005 is provided to surround a pixel portion 4002 provided over a first substrate 4001, and the pixel portion 4002 is sealed with the sealant 4005 and the second substrate 4006. In FIG. 6A, a scan line driver circuit 4004 and a signal line driver circuit 4003, which are formed using a single crystal semiconductor film or a polycrystalline semiconductor film over a substrate prepared separately, are mounted in a region different from the region surrounded by the sealant 4005 over the first substrate 4001. Various signals and potentials are supplied from flexible printed circuits (FPCs) 4018a and 4018b to the signal line driver circuit 4003 and the scan line driver circuit 4004, which are separately formed, and to the pixel portion 4002.

Figure 6B:
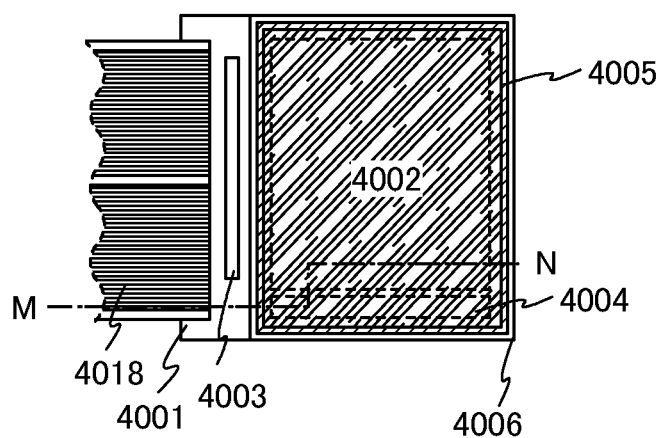
Figure 6C:
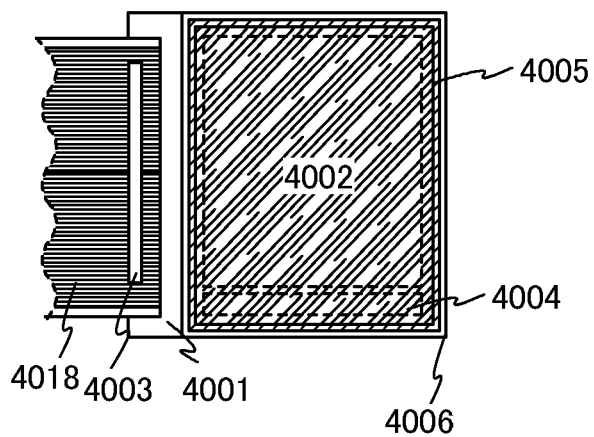

In FIGS. 6B and 6C, the sealant 4005 is provided to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with the display element, by the first substrate 4001, the sealant 4005, and the second substrate 4006. In FIGS. 6B and 6C, the signal line driver circuit 4003 formed using a single crystal semiconductor film or a polycrystalline semiconductor film over a substrate prepared separately is mounted in a region different from the region surrounded by the sealant 4005 over the first substrate 4001. In FIGS. 6B and 6C, various signals and potentials are supplied from an FPC 4018 to the signal line driver circuit 4003, which is separately formed, the scan line driver circuit 4004, and the pixel portion 4002.

Although FIGS. 6B and 6C each show the example in which the signal line driver circuit 4003 is formed separately and mounted on the first substrate 4001, the present invention is not limited to this configuration. The scan line driver circuit may be separately formed and then mounted, or only part of the signal line driver circuit or part of the scan line driver circuit may be separately formed and then mounted.

Note that there is no particular limitation on a connection method of a separately formed driver circuit, and a chip on glass (COG) method, a wire bonding method, a tape automated bonding (TAB) method or the like can be used. FIG. 6A shows an example in which the signal line driver circuit 4003 and the scan line driver circuit 4004 are mounted by a COG method. FIG. 6B shows an example in which the signal line driver circuit 4003 is mounted by a COG method. FIG. 6C shows an example in which the signal line driver circuit 4003 is mounted by a TAB method.

The display device includes in its category a panel in which a display element is sealed, and a module in which an IC such as a controller is mounted on the panel.

Note that a display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors; the transistor an example of which is described in any of Embodiments 1 to 4 can be applied thereto.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes, in its category, an inorganic electroluminescent (EL) element, an organic EL element, and the like. Furthermore, a display medium whose contrast is changed by an electric effect, such as electronic ink, can be used.

Figure 7:
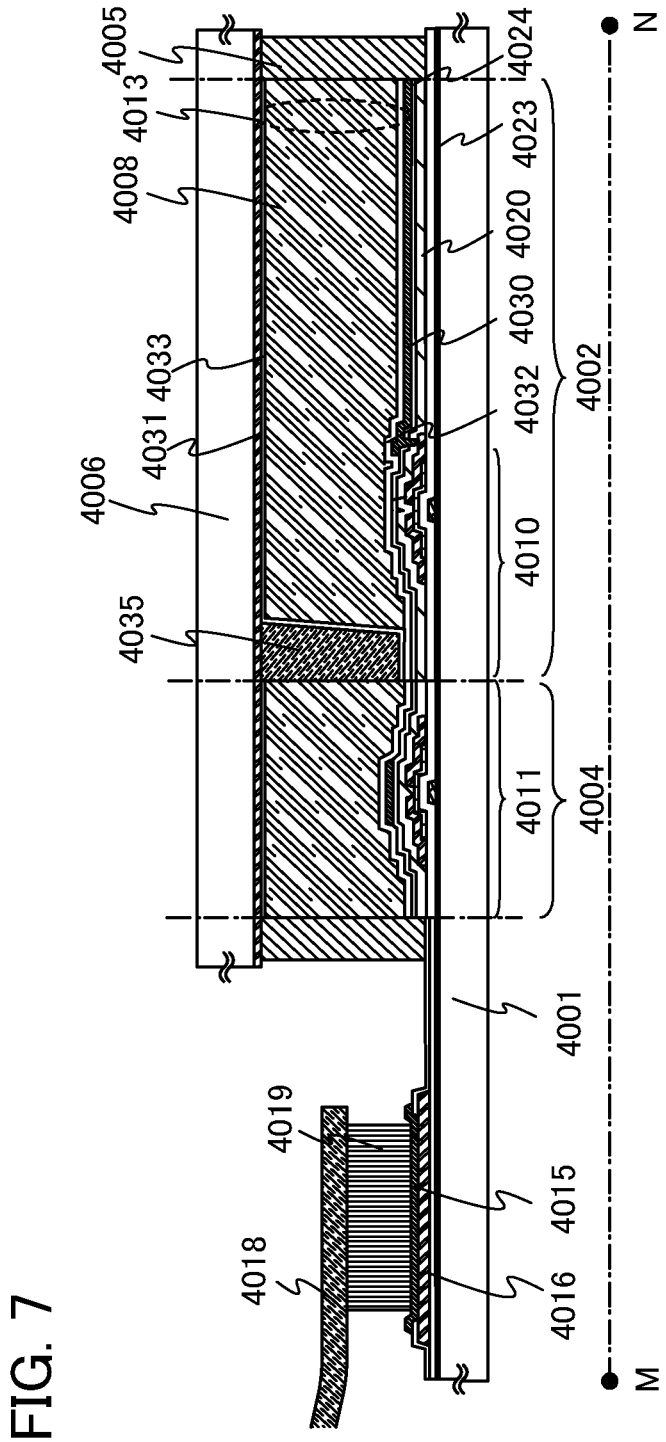
FIG. 7 illustrates one embodiment of a semiconductor device.
Figure 8:
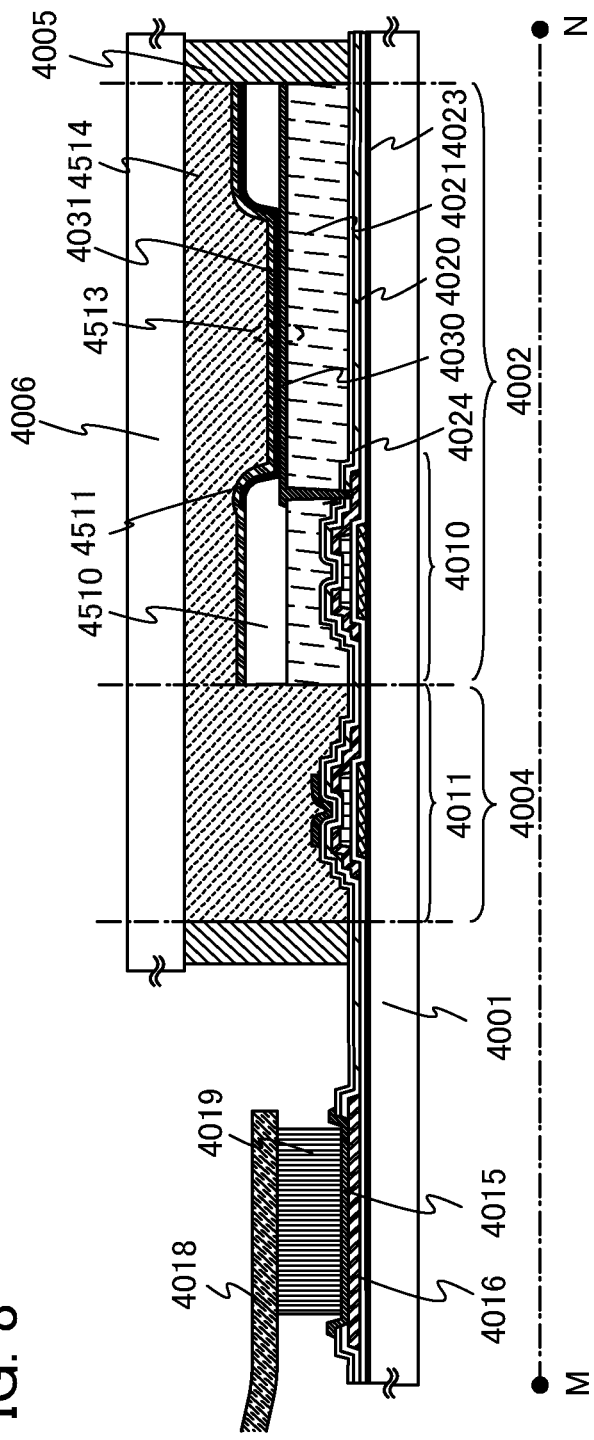
FIG. 8 illustrates one embodiment of a semiconductor device.
Figure 9:
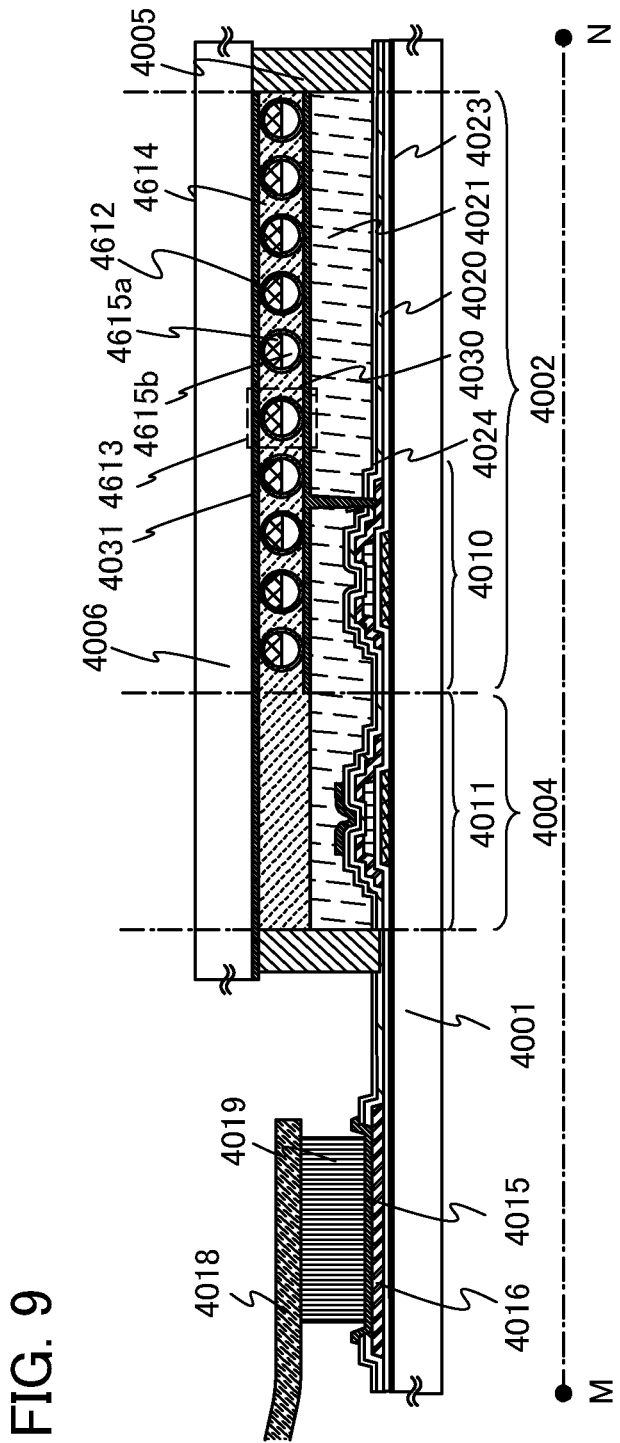
FIG. 9 illustrates one embodiment of a semiconductor device.

One embodiment of the semiconductor device is described with reference to FIG. 7, FIG. 8, and FIG. 9. FIG. 7 to FIG. 9 correspond to cross-sectional views taken along line M-N in FIG. 6B.

As shown in FIG. 7 to FIG. 9, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as source and drain electrode layers of transistors 4010 and 4011.

Each of the pixel portion 4002 and the scan line driver circuit 4004 provided over the first substrate 4001 includes a plurality of transistors. In FIG. 7 to FIG. 9, the transistor 4010 included in the pixel portion 4002 and the transistor 4011 included in the scan line driver circuit 4004 are shown as an example. In FIG. 7, an insulating layer 4020 and an insulating layer 4024 are provided over the transistors 4010 and 4011, and in FIG. 8 and FIG. 9, an insulating layer 4021 is further provided. Note that an insulating film 4023 is an insulating film serving as a base film.

In this embodiment, the transistors described in any of Embodiments 1 to 4 can be applied to the transistor 4010 and the transistor 4011.

Each of the transistors 4010 and 4011 includes a highly purified crystalline oxide semiconductor layer containing excess oxygen that compensates an oxygen vacancy. Therefore, the transistors 4010 and 4011 have less variation in electric characteristics and are electrically stable.

In this manner, it is possible to provide a semiconductor device with high reliability as the semiconductor devices shown in FIG. 7 to FIG. 9.

This embodiment shows examples in which a conductive layer is provided over the insulating layer so as to overlap with a channel formation region in the crystalline oxide semiconductor layer of the transistor 4011 for the driver circuit. The conductive layer is provided so as to overlap with the channel formation region in the crystalline oxide semiconductor layer, whereby the amount of change in the threshold voltage of the transistor 4011 before and after a BT test can be further reduced. The conductive layer may have the same potential as or a potential different from that of a gate electrode layer of the transistor 4011, and can function as a second gate electrode layer. The potential of the conductive layer may be GND, 0 V, or in a floating state.

In addition, the conductive layer functions to block an external electric field, that is, to prevent an external electric field (particularly, to prevent static electricity) from affecting the inside (circuit portion including a thin film transistor). A blocking function of the conductive layer can prevent variation in the electric characteristics of the transistor due to the influence of external electric field such as static electricity.

The transistor 4010 included in the pixel portion 4002 is electrically connected to a display element to form a display panel. A variety of display elements can be used as the display element as long as display can be performed.

An example of a liquid crystal display device using a liquid crystal element as a display element is shown in FIG. 7. In FIG. 7, a liquid crystal element 4013 which is a display element includes the first electrode layer 4030, a second electrode layer 4031, and a liquid crystal layer 4008. Insulating films 4032 and 4033 serving as orientation films are provided so that the liquid crystal layer 4008 is interposed therebetween. The second electrode layer 4031 is provided on the second substrate 4006 side, and the first electrode layer 4030 and the second electrode layer 4031 are stacked, with the liquid crystal layer 4008 interposed therebetween.

A columnar spacer 4035 obtained by selective etching of an insulating film is provided in order to control the thickness (cell gap) of the liquid crystal layer 4008. A spherical spacer may also be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

Alternatively, a liquid crystal exhibiting a blue phase for which an alignment film is unnecessary may be used. A blue phase is one of liquid crystal phases, which is generated just before a cholesteric phase changes into an isotropic phase while the temperature of a cholesteric liquid crystal is increased. Since the blue phase appears only in a narrow temperature range, a liquid crystal composition in which several weight percent or more of a chiral agent is mixed is used for the liquid crystal layer in order to improve the temperature range. The liquid crystal composition which includes a liquid crystal showing a blue phase and a chiral agent has a short response time and has optical isotropy, which makes the alignment process unneeded and the viewing angle dependence small. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, the productivity of the liquid crystal display device can be increased. A transistor including an oxide semiconductor layer has a possibility that electric characteristics of the transistor may vary significantly by the influence of static electricity and deviate from a designed range. Therefore, it is more effective to use a liquid crystal material showing a blue phase for the liquid crystal display device including a transistor which includes an oxide semiconductor layer.

The specific resistivity of the liquid crystal material is higher than or equal to $1 \times 10^9$ $\Omega \cdot$cm, preferably higher than or equal to $1 \times 10^{11}$ $\Omega \cdot$cm, more preferably higher than or equal to $1 \times 10^{12}$ $\Omega \cdot$cm. Note that the specific resistance in this specification is measured at 20° C.

The capacitance of storage capacitor formed in the liquid crystal display device is set considering the leakage current of the transistor provided in the pixel portion or the like so that charge can be held for a predetermined period. The capacitance of the storage capacitor may be set considering the off-state current of a transistor or the like. By using a transistor including a highly purified crystalline oxide semiconductor layer, it is enough to provide a storage capacitor having a capacitance that is less than or equal to $\frac{1}{3}$, preferably less than or equal to $\frac{1}{5}$ of a liquid crystal capacitance of each pixel.

In the transistor used in this embodiment, which includes the highly purified crystalline oxide semiconductor layer, the current in an off state (off-state current value) can be made small. Accordingly, an electric signal such as an image signal can be held for a longer period, and a writing interval can be set longer in an on state. Accordingly, the frequency of refresh operation can be reduced, which leads to an effect of suppressing power consumption.

The field-effect mobility of the transistor including a highly purified crystalline oxide semiconductor layer used in this embodiment can be relatively high, enabling high-speed operation. For example, when such a transistor which can operate at high speed is used for a liquid crystal display device, a switching transistor in a pixel portion and a driver transistor in a driver circuit portion can be formed over one substrate. That is, since a semiconductor device formed using a silicon wafer or the like is not additionally needed as a driver circuit, the number of components of the semiconductor device can be reduced. In addition, by using a transistor which can operate at high speed in a pixel portion, a high-quality image can be provided.

For the liquid crystal display device, it is possible to use a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like.

A normally black liquid crystal display device such as a transmissive liquid crystal display device utilizing a vertical alignment (VA) mode may also be used. There are some examples of the vertical alignment mode, such as a multi-domain vertical alignment (MVA) mode, a patterned vertical alignment (PVA) mode, and an advanced super view (ASV) mode. Furthermore, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (light-blocking layer), an optical member (optical substrate) such as a polarizing member, a retardation member, or an anti-reflection member, and the like are provided as appropriate. For example, circular polarization using a polarizing substrate and a retardation substrate may be used. In addition, a backlight, a side light, or the like may be used as a light source.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that the disclosed invention is not limited to the application to a display device for color display; the disclosed invention can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound; in general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element configurations into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is interposed between dielectric layers, which are further interposed between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes has a light-transmitting property. A transistor and a light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

FIG. 8 illustrates an example of a light-emitting device in which a light-emitting element is used as a display element. A light-emitting element 4513 which is a display element is electrically connected to the transistor 4010 provided in the pixel portion 4002. A configuration of the light-emitting element 4513 is not limited to the layered structure including the first electrode layer 4030, an electroluminescent layer 4511, and the second electrode layer 4031, which is illustrated in FIG. 8. The configuration of the light-emitting element 4513 can be changed as appropriate depending on a direction in which light is extracted from the light-emitting element 4513, or the like.

A partition wall 4510 can be formed using an organic insulating material or an inorganic insulating material. It is particularly preferable that the partition wall 4510 be formed using a photosensitive resin material to have an opening over the first electrode layer 4030 so that a sidewall of the opening is formed as a tilted surface with continuous curvature.

The electroluminescent layer 4511 may be formed using a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed. In addition, in a space which is formed with the first substrate 4001, the second substrate 4006, and the sealant 4005, a filler 4514 is provided for sealing. It is preferable that a panel be packaged (sealed) with a protective film (such as a laminate film or an ultraviolet curable resin film) or a cover material with high air-tightness and little degasification so that the panel is not exposed to the outside air, in this manner.

As the filler 4514, an ultraviolet curable resin or a thermosetting resin can be used as well as an inert gas such as nitrogen or argon. For example, polyvinyl chloride (PVC), an acrylic resin, polyimide, an epoxy resin, a silicone resin, polyvinyl butyral (PVB), or ethylene vinyl acetate (EVA) can be used. For example, nitrogen is used for the filler.

In addition, if needed, an optical film, such as a polarizing plate, a circularly polarizing plate (including an elliptically polarizing plate), a retardation plate (quarter-wave plate or half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, an electronic paper in which electronic ink is driven can be provided as the display device. The electronic paper is also referred to as an electrophoretic display device (electrophoretic display) and is advantageous in that it has the same level of readability as plain paper, it has lower power consumption than other display devices, and it can be made thin and lightweight.

An electrophoretic display device can have various modes. An electrophoretic display device contains a plurality of microcapsules dispersed in a solvent or a solute, and each microcapsule contains first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

FIG. 9 illustrates an active matrix electronic paper as an embodiment of a semiconductor device. The electronic paper in FIG. 9 is an example of a display device using a twisting ball display system. The twist ball display method refers to a method in which spherical particles each colored in black and white are arranged between electrode layers included in a display element, and a potential difference is generated between the electrode layers to control the orientation of the spherical particles, so that display is performed.

Between the first electrode layer 4030 connected to the transistor 4010 and the second electrode layer 4031 provided on the second substrate 4006, spherical particles 4613 each including a black region 4615a, a white region 4615b, and a cavity 4612 which is filled with liquid around the black region 4615a and the white region 4615b, are provided. A space around the spherical particles 4613 is filled with a filler 4614 such as a resin. The second electrode layer 4031 corresponds to a common electrode (counter electrode). The second electrode layer 4031 is electrically connected to a common potential line.

Note that in FIG. 7 to FIG. 9, a flexible substrate as well as a glass substrate can be used as the first substrate 4001 and the second substrate 4006. For example, a plastic substrate having light-transmitting properties can be used. For plastic, a fiberglass-reinforced plastics (FRP) plate, a polyvinyl fluoride (PVF) film, a polyester film, or an acrylic resin film can be used. In addition, a sheet with a structure in which an aluminum foil is interposed between PVF films or polyester films can be used.

In this embodiment, a silicon oxide film is used as a gate insulating layer, and an aluminum oxide film is used as the insulating layer 4020. The gate insulating layer and the insulating layer 4020 can be formed by a sputtering method or a plasma CVD method.

The aluminum oxide film provided as the insulating layer 4020 over an oxide semiconductor layer has a high shielding effect (blocking effect) and thus is less likely to transmit both oxygen and impurities such as hydrogen and moisture.

Accordingly, the aluminum oxide film serves as a protection film that prevents entry of impurities such as hydrogen and moisture, which cause variation in the electric characteristics of a transistor, into the oxide semiconductor layer and release of oxygen, which is a main component material of the oxide semiconductor, from the oxide semiconductor layer during and after the manufacturing process.

The silicon oxide film provided as the gate insulating layer in contact with the oxide semiconductor layer has a function of supplying oxygen to the oxide semiconductor layer. Therefore, the gate insulating layer is preferably an oxide insulating layer containing a large amount of oxygen.

The transistor 4010 and the transistor 4011 each include a crystalline oxide semiconductor layer which is formed by crystallization of an amorphous oxide semiconductor layer. In addition, the transistor 4010 and the transistor 4011 each include a silicon oxide film as a gate insulating layer. Heat treatment for crystallizing the amorphous oxide semiconductor layer is performed in a state where the amorphous oxide semiconductor layer is interposed between the silicon oxide film formed as the gate insulating layer in contact with the amorphous oxide semiconductor layer and the aluminum oxide film formed as the insulating layer 4020; therefore, oxygen can be prevented from being released from the amorphous oxide semiconductor layer by the heat treatment for crystallization. Thus, the crystalline oxide semiconductor layer obtained in this manner can maintain the amount of oxygen which has been contained in the amorphous oxide semiconductor layer, and include a region containing excess oxygen as compared to a stoichiometric composition ratio of an oxide semiconductor in a crystalline state.

Therefore, the crystalline oxide semiconductor layer formed has high purity because impurities such as hydrogen and moisture are not mixed therein, and includes the region containing excess oxygen as compared to a stoichiometric composition ratio of an oxide semiconductor in a crystalline state because oxygen is prevented from being released. Accordingly, by using the crystalline oxide semiconductor layer for each of the transistors 4010 and 4011, it is possible to reduce variation in the threshold voltage ($V_{th}$) of the transistor due to an oxygen vacancy and a shift of the threshold voltage ($\Delta V_{th}$).

The insulating layer 4021 serving as a planarization insulating film can be formed using an organic material having heat resistance, such as acrylic, polyimide, benzocyclobutene, polyamide, or epoxy. Other than such organic materials, it is also possible to use a low-dielectric constant material (low-k material), a siloxane-based resin, PSG (phosphosilicate glass), BPSG (borophosphosilicate glass), or the like. The insulating layer may be formed by stacking a plurality of insulating films formed using these materials.

There is no particular limitation on the method of forming the insulating layer 4021, and any of the following can be used depending on a material thereof: a method such as a sputtering method, an SOG method, spin coating, dipping, spray coating, a droplet discharging method (e.g., an inkjet method), screen printing, or offset printing; a tool (equipment) such as doctor knife, roll coater, curtain coater, or knife coater; or the like.

The display device displays an image by transmitting light from a light source or a display element. Therefore, the substrate and the thin films such as the insulating film and the conductive film provided for the pixel portion where light is transmitted have light-transmitting properties with respect to light in the visible-light wavelength range.

The first electrode layer 4030 and the second electrode layer 4031 (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or graphene.

The first electrode layer 4030 and the second electrode layer 4031 can alternatively be formed using one or plural kinds selected from metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A conductive composition containing a conductive high molecule (also referred to as a conductive polymer) can be used for the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken owing to static electricity or the like, a protective circuit for protecting the driver circuit is preferably provided. The protection circuit is preferably formed using a nonlinear element.

As described above, by using any of the transistors described in Embodiments 1 to 4, a semiconductor device having a variety of functions can be provided.

Embodiment 6

A semiconductor device having an image sensor function for reading information of an object can be formed with the use of the transistors the transistor an example of which is described in any of Embodiments 1 to 4.

Figure 10A:
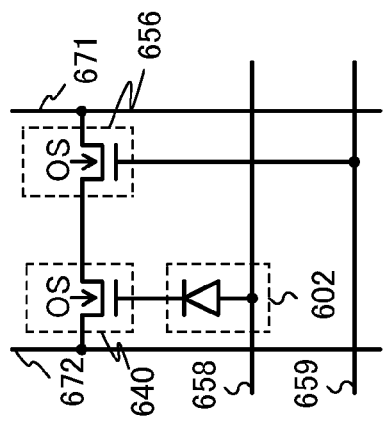
FIGS. 10A and 10B illustrate one embodiment of a semiconductor device.

FIG. 10A shows an example of a semiconductor device having an image sensor function. FIG. 10A is an equivalent circuit of a photo sensor and FIG. 10B is a cross-sectional view showing part of the photo sensor.

In a photodiode 602, one electrode is electrically connected to a photodiode reset signal line 658, and the other electrode is electrically connected to a gate of a transistor 640. One of a source and a drain of the transistor 640 is electrically connected to a photo sensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photo sensor output signal line 671.

Note that in circuit diagrams in this specification, a transistor including an oxide semiconductor layer is denoted by a symbol "OS" so as to be identified as a transistor including an oxide semiconductor layer. In FIG. 10A, the transistor 640 and the transistor 656 are transistors including a crystalline oxide semiconductor layer such as the crystalline oxide semiconductor layer in the transistor 410 described in Embodiment 1.

Figure 10B:
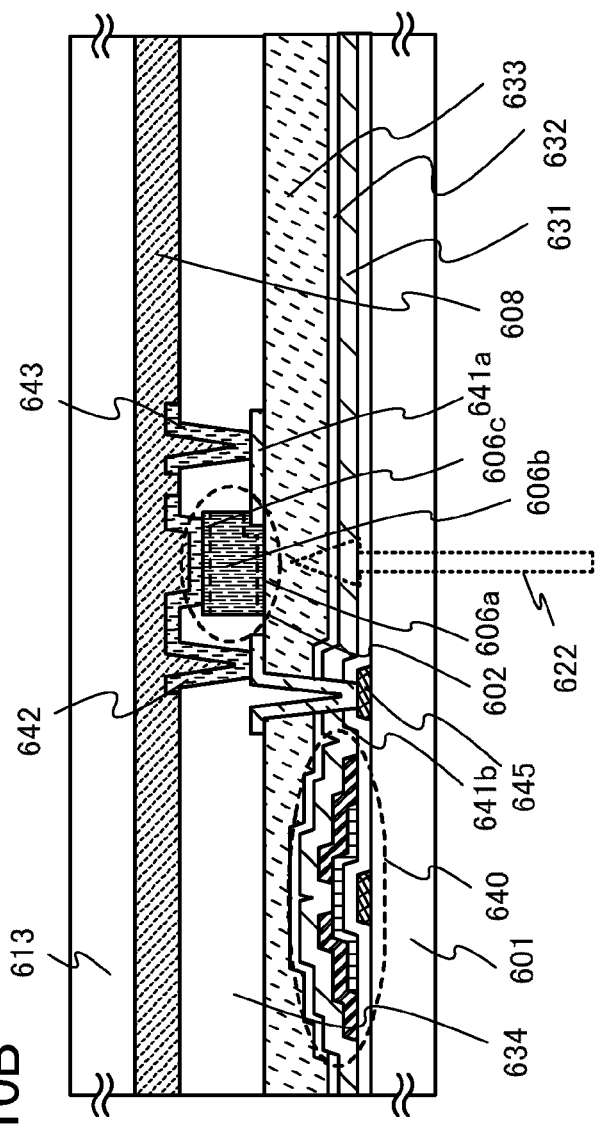

FIG. 10B is a cross-sectional view of the photodiode 602 and the transistor 640 in a photo sensor. The photodiode 602 functioning as a sensor and the transistor 640 are provided over a substrate 601 (TFT substrate) having an insulating surface. A substrate 613 is provided over the photodiode 602 and the transistor 640 with an adhesive layer 608 interposed therebetween.

An insulating layer 631, an insulating layer 632, an interlayer insulating layer 633, and an interlayer insulating layer 634 are provided over the transistor 640. The photodiode 602 is provided over the interlayer insulating layer 633. In the photodiode 602, a first semiconductor layer 606a, a second semiconductor layer 606b, and a third semiconductor layer 606c are sequentially stacked from the interlayer insulating layer 633 side, between electrode layers 641a and 641b formed over the interlayer insulating layer 633 and an electrode layer 642 formed over the interlayer insulating layer 634.

The electrode layer 641a is electrically connected to a conductive layer 643 formed in the interlayer insulating layer 634, and the electrode layer 642 is electrically connected to a gate electrode layer 645 through the electrode layer 641b. The gate electrode layer 645 is electrically connected to a gate electrode layer of the transistor 640, and the photodiode 602 is electrically connected to the transistor 640.

Here is shown, as an example, a pin photodiode including a stack of a semiconductor layer having a p-type conductivity as the first semiconductor layer 606a, a high-resistance semiconductor layer (I-type semiconductor layer) as the second semiconductor layer 606b, and a semiconductor layer having an n-type conductivity as the third semiconductor layer 606c.

The first semiconductor layer 606a is a p-type semiconductor layer and can be formed using an amorphous silicon film containing an impurity element imparting a p-type conductivity. The first semiconductor layer 606a is formed by a plasma CVD method with use of a semiconductor source gas containing an impurity element belonging to Group 13 (e.g., boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film by a diffusion method or an ion injecting method. Heating or the like may be conducted after introducing the impurity element by an ion injecting method or the like in order to diffuse the impurity element. In this case, as a method of forming the amorphous silicon film, an LPCVD method, a vapor deposition method, a sputtering method, or the like may be used. The first semiconductor layer 606a is preferably formed with a thickness greater than or equal to 10 nm and less than or equal to 50 nm.

The second semiconductor layer 606b is an I-type semiconductor layer (intrinsic semiconductor layer) and is formed using an amorphous silicon film. As for formation of the second semiconductor layer 606b, an amorphous silicon film is formed with use of a semiconductor source gas by a plasma CVD method. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor layer 606b may be alternatively formed by an LPCVD method, a vapor deposition method, a sputtering method, or the like. The second semiconductor layer 606b is preferably formed with a thickness greater than or equal to 200 nm and less than or equal to 1000 nm.

The third semiconductor layer 606c is an n-type semiconductor layer and is formed using an amorphous silicon film containing an impurity element imparting an n-type conductivity. The third semiconductor layer 606c is formed by a plasma CVD method with use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion injecting method. Heating or the like may be conducted after introducing the impurity element by an ion injecting method or the like in order to diffuse the impurity element. In this case, as a method of forming the amorphous silicon film, an LPCVD method, a vapor deposition method, a sputtering method, or the like may be used. The third semiconductor layer 606c is preferably formed with a thickness greater than or equal to 20 nm and less than or equal to 200 nm.

The first semiconductor layer 606a, the second semiconductor layer 606b, and the third semiconductor layer 606c are not necessarily formed using an amorphous semiconductor and may be formed using a polycrystalline semiconductor, a microcrystalline semiconductor (semi-amorphous semiconductor (SAS)).

The microcrystalline semiconductor belongs to a metastable state of an intermediate between amorphous and single crystalline when Gibbs free energy is considered. That is, the microcrystalline semiconductor film is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wave numbers than 520 cm$^{-1}$, which represents a peak of the Raman spectrum of single crystal silicon. That is, the peak of the Raman spectrum of the microcrystalline silicon exists between 520 cm$^{-1}$ which represents single crystal silicon and 480 cm$^{-1}$ which represents amorphous silicon. In addition, microcrystalline silicon contains hydrogen or halogen of at least 1 atomic percent or more in order to terminate a dangling bond. Moreover, microcrystalline silicon contains a rare gas element such as helium, argon, krypton, or neon to further promote lattice distortion, so that stability is increased and a favorable microcrystalline semiconductor can be obtained.

This microcrystalline semiconductor film can be formed by a high-frequency plasma CVD method with a frequency of higher than or equal to several tens of megahertz and lower than or equal to several hundreds of megahertz or a microwave plasma CVD method with a frequency of 1 GHz or higher. The microcrystalline semiconductor film can be typically formed using a dilution of silicon hydride such as $SiH_4$, $Si_2H_6$, $SiH_2Cl_2$, $SiHCl_3$, $SiCl_4$, or $SiF_4$ with hydrogen. With a dilution with one or plural kinds of rare gas elements selected from helium, argon, krypton, or neon in addition to silicon hydride and hydrogen, the microcrystalline semiconductor film can be formed. In that case, the flow ratio of hydrogen to silicon hydride is 5:1 to 200:1, preferably 50:1 to 150:1, more preferably 100:1. Further, a carbide gas such as $CH_4$ or $C_2H_6$, a gas containing germanium such as $GeH_4$ or $GeF_4$, $F_2$, or the like may be mixed into the gas containing silicon.

In addition, since the mobility of holes generated by the photoelectric effect is lower than that of electrons, a pin photodiode has better characteristics when a surface on the p-type semiconductor layer side is used as a light-receiving plane. Here is shown an example in which light received by the photodiode 602 from a surface of the substrate 601, over which the pin photodiode is formed, is converted into electric signals. Further, light approaching the semiconductor layer having a conductivity type opposite from that of the semiconductor layer on the light-receiving plane is disturbance light; therefore, the electrode layer on the semiconductor layer having the opposite conductivity type is preferably formed using a light-blocking conductive film. Note that a surface of the n-type semiconductor layer side can alternatively be used as the light-receiving plane.

With the use of an insulating material, the insulating layer 632, the interlayer insulating layer 633, and the interlayer insulating layer 634 can be formed, depending on the material, with a method such as a sputtering method, a plasma CVD method, an SOG method, spin coating, dipping, spray coating, a droplet discharge method (e.g., an inkjet method), screen printing, offset printing, or the like, or a tool (equipment) such as a doctor knife, a roll coater, a curtain coater, or a knife coater.

In this embodiment, an aluminum oxide film is used as the insulating layer 631. The insulating layer 631 can be formed by a sputtering method, a plasma CVD method, or the like.

The aluminum oxide film provided as the insulating layer 631 over the oxide semiconductor layer has a high shielding effect (blocking effect) and thus is less likely to transmit both oxygen and impurities such as hydrogen and moisture.

Accordingly, the aluminum oxide film serves as a protection film that prevents entry of impurities such as hydrogen and moisture, which cause variation in the electric characteristics of a transistor, into the oxide semiconductor layer and release of oxygen, which is a main component material of the oxide semiconductor, from the oxide semiconductor layer during and after the manufacturing process.

In this embodiment, the transistor 640 each includes a crystalline oxide semiconductor layer which is formed by crystallization of an amorphous oxide semiconductor layer. In addition, the transistor 640 includes a silicon oxide film as a gate insulating layer. Heat treatment for crystallizing the amorphous oxide semiconductor layer is performed in a state where the amorphous oxide semiconductor layer is interposed between the silicon oxide film formed as the gate insulating layer in contact with the amorphous oxide semiconductor layer and the aluminum oxide film formed as the insulating layer 631; therefore, oxygen can be prevented from being released from the amorphous oxide semiconductor layer by the heat treatment for crystallization. Thus, the crystalline oxide semiconductor layer obtained in this manner can maintain the amount of oxygen which has been contained in the amorphous oxide semiconductor layer, and include a region containing excess oxygen as compared to a stoichiometric composition ratio of an oxide semiconductor in a crystalline state.

Therefore, the crystalline oxide semiconductor layer formed has high purity because impurities such as hydrogen and moisture are not mixed therein, and includes the region containing excess oxygen as compared to a stoichiometric composition ratio of an oxide semiconductor in a crystalline state because oxygen is prevented from being released. Accordingly, by using the crystalline oxide semiconductor layer for the transistor 640, it is possible to reduce variation in the threshold voltage ($V_{th}$) of the transistor due to an oxygen vacancy and a shift of the threshold voltage ($\Delta V_{th}$).

The insulating layer 632 can be formed using an inorganic insulating material and can have a single-layer structure or a layered structure including any of oxide insulating layers such as a silicon oxide layer, a silicon oxynitride layer, an aluminum oxide layer, and an aluminum oxynitride layer; and nitride insulating layers such as a silicon nitride layer, a silicon nitride oxide layer, an aluminum nitride layer, and an aluminum nitride oxide layer.

For reduction of the surface unevenness, an insulating layer functioning as a planarization insulating film is preferably used as the interlayer insulating layers 633 and 634. For the interlayer insulating layers 633 and 634, an organic insulating material having heat resistance such as polyimide, acrylic resin, benzocyclobutene resin, polyamide, or epoxy resin can be used. Other than such organic insulating materials, it is possible to use a single layer or stacked layers of a low-dielectric constant material (low-k material), a siloxane-based resin, phosphosilicate glass (PSG), borophosphosilicate glass (BPSG), or the like.

With detection of light 622 that enters the photodiode 602, information of an object to be detected can be read. Note that a light source such as a backlight can be used at the time of reading information of an object.

As described above, a transistor which includes a highly purified crystalline oxide semiconductor layer containing excess oxygen which compensates an oxygen vacancy has less variation in electric characteristics and is electrically stable. Thus, by using the transistor, a highly reliable semiconductor device can be provided.

This embodiment can be combined with any of the structures described in the other embodiments as appropriate.

Embodiment 7

The transistor an example of which is described in any of Embodiments 1 to 4 can be favorably used for a semiconductor device including an integrated circuit in which a plurality of transistors are stacked. This embodiment shows a memory medium (memory element) as an example of a semiconductor device.

In this embodiment, a semiconductor device including a transistor 140 that is a first transistor formed over a single crystal semiconductor substrate, and a transistor 162 that is a second transistor formed using a semiconductor film above the transistor 140 with an insulating layer interposed therebetween, is manufactured. The transistor an example of which is described in any of Embodiments 1 to 4 can be favorably used as the transistor 162. This embodiment shows an example in which a transistor having a structure similar to that of the transistor 440 described in Embodiment 2 is used as the transistor 162.

Semiconductor materials and structures of the transistor 140 and the transistor 162, which are stacked, may be the same or different. This embodiment shows an example in which a transistor with a suitable material and structure is used in each circuit of a memory medium (memory element).

Figure 5A:
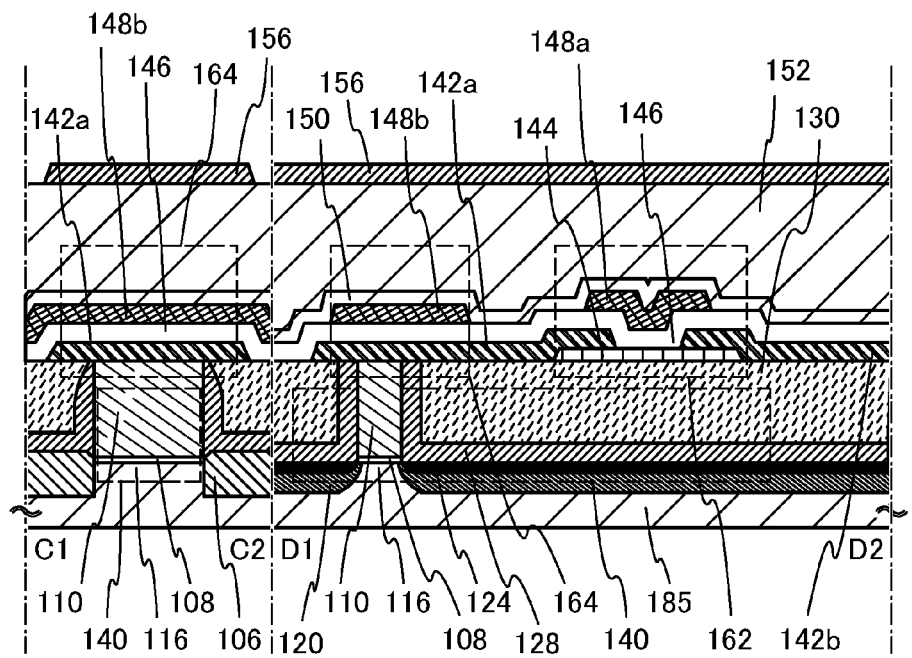
FIGS. 5A to 5C illustrate one embodiment of a semiconductor device.
Figure 5B:
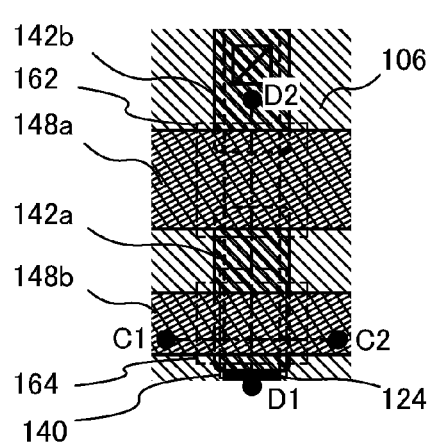
Figure 5C:
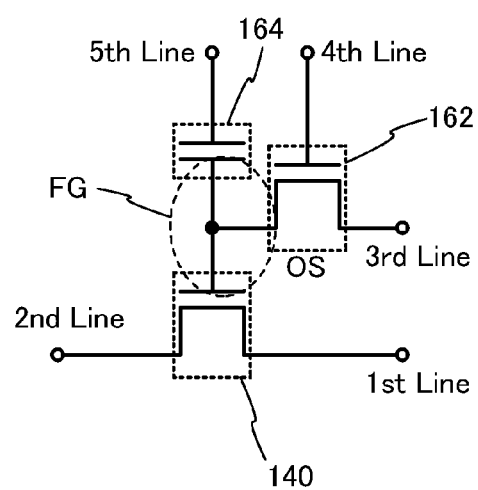

FIGS. 5A to 5C illustrate an example of a configuration of a semiconductor device. FIG. 5A illustrates a cross section of the semiconductor device, and FIG. 5B illustrates a plan view of the semiconductor device. Here, FIG. 5A corresponds to a cross section along line C1-C2 and line D1-D2 in FIG. 5B. In addition, FIG. 5C illustrates an example of a diagram of a circuit including the semiconductor device as a memory element. The semiconductor device illustrated in FIGS. 5A and 5B includes a transistor 140 including a first semiconductor material in a lower portion, and a transistor 162 including a second semiconductor material in an upper portion. In this embodiment, the first semiconductor material is a semiconductor material other than an oxide semiconductor, and the second semiconductor material is an oxide semiconductor. As the semiconductor material other than an oxide semiconductor, for example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at high speed easily. On the other hand, a transistor including an oxide semiconductor can hold charge for a long time owing to its characteristics.

A method of manufacturing the semiconductor device in FIGS. 5A to 5C will be described with reference to FIGS. 5A to 5C.

The transistor 140 includes a channel formation region 116 provided in a substrate 185 containing a semiconductor material (e.g., silicon), impurity regions 120 provided so that the channel formation region 116 is interposed therebetween, metal compound regions 124 in contact with the impurity regions 120, a gate insulating layer 108 provided over the channel formation region 116, and a gate electrode 110 provided over the gate insulating layer 108.

As the substrate 185 containing a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. Note that although the term "SOI substrate" generally means a substrate in which a silicon semiconductor layer is provided on an insulating surface, the term "SOI substrate" in this specification and the like also includes a substrate in which a semiconductor layer containing a material other than silicon is provided on an insulating surface. That is, a semiconductor layer included in the "SOI substrate" is not limited to a silicon semiconductor layer. Moreover, the SOI substrate can be a substrate having a configuration in which a semiconductor layer is provided over an insulating substrate such as a glass substrate, with an insulating layer interposed therebetween.

As a method of forming the SOI substrate, any of the following methods can be used: a method in which oxygen ions are implanted into a mirror-polished wafer and then heating is performed at a high temperature, whereby an oxide layer is formed at a certain depth from a surface of the wafer and a defect caused in the surface layer is eliminated; a method in which a semiconductor substrate is separated by utilizing a phenomenon in which microvoids formed by hydrogen ion irradiation grow because of heat treatment; a method in which a single crystal semiconductor layer is formed over an insulating surface by crystal growth; and the like.

For example, ions are added through one surface of a single crystal semiconductor substrate, an embrittlement layer is formed at a certain depth from the surface of the single crystal semiconductor substrate, and an insulating layer is formed over one of the surface of the single crystal semiconductor substrate and an element substrate. Heat treatment is performed in a state where the single crystal semiconductor substrate and the element substrate are bonded to each other with the insulating layer interposed therebetween, so that a crack is generated in the embrittlement layer and the single crystal semiconductor substrate is separated along the embrittlement layer. Accordingly, a single crystal semiconductor layer, which is separated from the single crystal semiconductor substrate, is formed as a semiconductor layer over the element substrate. An SOI substrate formed by the above method can also be favorably used.

An element isolation insulating layer 106 is provided over the substrate 185 so as to surround the transistor 140. Note that it is preferable that the transistor 140 do not have a sidewall insulating layer as illustrated in FIGS. 5A to 5C in order to achieve high integration. On the other hand, when importance is put on the characteristics of the transistor 140, sidewall insulating layers may be provided on side surfaces of the gate electrode 110 and the impurity regions 120 including a region whose impurity concentrations are different may be provided.

The transistor 140 formed using a single crystal semiconductor substrate can operate at high speed. Thus, when the transistor is used as a reading transistor, data can be read at high speed.

Two insulating layers are formed so as to cover the transistor 140. As treatment before the transistor 162 and a capacitor 164 are formed, CMP treatment is performed on the two insulating layers, whereby planarized insulating layers 128 and 130 are formed, and at the same time, an upper surface of the gate electrode 110 is exposed.

As each of the insulating layer 128 and the insulating layer 130, typically, it is possible to use an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film. The insulating layer 128 and the insulating layer 130 can be formed by a plasma CVD method, a sputtering method, or the like.

Alternatively, an organic material such as polyimide, an acrylic resin, or a benzocyclobutene resin can be used. Other than such organic materials, it is also possible to use a low-dielectric constant material (low-k material) or the like. In the case of using an organic material, a wet process such as a spin coating method or a printing method may be used to form the insulating layer 128 and the insulating layer 130.

Note that in the insulating layer 130, a film to be in contact with the semiconductor layer is formed using a silicon oxide film.

In this embodiment, the insulating layer 128 is formed using a silicon oxynitride film with a thickness of 50 nm formed by a sputtering method, and the insulating layer 130 is formed using a silicon oxide film with a thickness of 550 nm formed by a sputtering method.

A semiconductor film is formed over the insulating layer 130 which has been sufficiently planarized by CMP treatment. In this embodiment, the semiconductor film is formed using an amorphous oxide semiconductor film formed by a sputtering method using an In—Ga—Zn—O-based oxide target so as to include a region containing excess oxygen as compared to a stoichiometric composition ratio of an oxide semiconductor in a crystalline state.

Next, the amorphous oxide semiconductor film is selectively etched, so that an amorphous oxide semiconductor layer is formed.

Next, a conductive layer is formed over the gate electrode 110, the insulating layer 128, the insulating layer 130, and the like, and etched selectively, so that a source or drain electrode 142a and a source or drain electrode 142b are formed.

The conductive layer can be formed by a PVD method such as a sputtering method, a CVD method such as a plasma CVD method. Further, as the material of the conductive layer, an element selected from Al, Cr, Cu, Ta, Ti, Mo, and W, an alloy containing the above element as its component, or the like can be used. Any of Mn, Mg, Zr, Be, Nd, and Sc, or a material containing any of these in combination may be used.

The conductive layer can have a single-layer structure or a layered structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that in the case where the conductive layer has a single-layer structure of a titanium film or a titanium nitride film, there is an advantage that the conductive layer is easily processed into the source or drain electrode 142a and the source or drain electrode 142b having tapered shapes.

The channel length (L) of the upper transistor 162 is determined by a distance between a lower edge portion of the source or drain electrode 142a and a lower edge portion of the source or drain electrode 142b. Note that for light exposure for forming a mask used in the case where a transistor with a channel length (L) of less than 25 nm is formed, it is preferable to use extreme ultraviolet rays whose wavelength is as short as several nanometers to several tens of nanometers.

Next, the gate insulating layer 146 is formed in contact with the amorphous oxide semiconductor layer. The gate insulating layer 146 can be formed using any of a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, and a gallium oxide film by a plasma CVD method, a sputtering method, or the like.

Next, over the gate insulating layer 146, a gate electrode 148a is formed in a region overlapping with the amorphous oxide semiconductor layer, and an electrode 148b is formed in a region overlapping with the source or drain electrode 142a.

The gate electrode 148a and the electrode 148b can be formed in such a manner that a conductive layer is formed over the gate insulating layer 146 and then etched selectively.

Next, an insulating layer 150 including an aluminum oxide film is formed over the amorphous oxide semiconductor layer, the gate insulating layer 146, the gate electrode 148a, and the electrode 148b. In the case where the insulating layer 150 has a layered structure, a stack of the aluminum oxide film and a silicon oxide film, a silicon nitride film, a silicon oxynitride film, a silicon nitride oxide film, an aluminum nitride film, an aluminum oxynitride film, an aluminum nitride oxide film, a hafnium oxide film, or a gallium oxide film may be formed by a plasma CVD method, a sputtering method, or the like.

Next, heat treatment is performed on the amorphous oxide semiconductor layer so that at least part of the amorphous oxide semiconductor layer is crystallized and a crystalline oxide semiconductor layer 144 which includes a crystal having a c-axis substantially perpendicular to a surface of the crystalline oxide semiconductor layer 144 is formed.

The aluminum oxide film provided as the insulating layer 150 over the amorphous oxide semiconductor layer has a high shielding effect (blocking effect) and thus is less likely to transmit both oxygen and impurities such as hydrogen and moisture.

Accordingly, the aluminum oxide film serves as a protection film that prevents entry of impurities such as hydrogen and moisture, which cause variation in the electric characteristics of a transistor, into the oxide semiconductor layer and release of oxygen, which is a main component material of the oxide semiconductor, from the oxide semiconductor layer during and after the manufacturing process.

The heat treatment for crystallizing the amorphous oxide semiconductor layer is performed in a state where the amorphous oxide semiconductor layer is interposed between the silicon oxide film formed as the insulating layer 130 and the aluminum oxide film formed as the insulating layer 150; therefore, oxygen can be prevented from being released from the amorphous oxide semiconductor layer by the heat treatment for crystallization. Thus, the crystalline oxide semiconductor layer 144 obtained in this manner can maintain the amount of oxygen which has been contained in the amorphous oxide semiconductor layer, and include a region containing excess oxygen as compared to a stoichiometric composition ratio of an oxide semiconductor in a crystalline state.

Therefore, the crystalline oxide semiconductor layer 144 formed has high purity because impurities such as hydrogen and moisture are not mixed therein, and includes the region containing excess oxygen as compared to a stoichiometric composition ratio of an oxide semiconductor in a crystalline state because oxygen is prevented from being released. Accordingly, by using the crystalline oxide semiconductor layer 144 for the transistor 162, it is possible to reduce variation in the threshold voltage ($V_{th}$) of the transistor due to an oxygen vacancy and a shift of the threshold voltage ($\Delta V_{th}$).

The heat treatment for crystallizing at least part of the amorphous oxide semiconductor layer is performed at temperatures higher than or equal to 250° C. and lower than or equal to 700° C., preferably higher than or equal to 400° C., more preferably higher than or equal to 500° C., even more preferably higher than or equal to 550° C.

Next, an insulating layer 152 is formed over the transistor 162 and the insulating layer 150. The insulating layer 152 can be formed by a sputtering method, a CVD method, or the like. The insulating layer 152 can be formed using a material including an inorganic insulating material such as silicon oxide, silicon oxynitride, silicon nitride, hafnium oxide, or aluminum oxide.

Next, an opening that reaches the source or drain electrode 142b is formed in the gate insulating layer 146, the insulating layer 150, and the insulating layer 152. The opening is formed by selective etching with the use of a mask or the like.

After that, a wiring 156 is formed in the opening to be in contact with the source or drain electrode 142b. Note that a connection point of the source or drain electrode 142b and the wiring 156 is not illustrated in FIGS. 5A to 5C.

The wiring 156 is formed in such a manner that a conductive layer is formed by a PVD method such as a sputtering method or a CVD method such as a plasma CVD method and then the conductive layer is etched. Further, as the material of the conductive layer, an element selected from Al, Cr, Cu, Ta, Ti, Mo, and W, an alloy containing the above element as its component, or the like can be used. Any of Mn, Mg, Zr, Be, Nd, and Sc, or a material containing any of these in combination may be used. The details are the same as source or drain electrode 142a.

Through the above steps, the transistor 162 and the capacitor 164 are completed. The transistor 162 includes the highly purified crystalline oxide semiconductor layer 144 containing excess oxygen which compensates an oxygen vacancy. Therefore, the transistor 162 has less variation in electric characteristics and is electrically stable. The capacitor 164 includes the source or drain electrode 142a, the gate insulating layer 146, and the electrode 148b.

The capacitor 164 may be omitted in the case where a capacitor is not needed.

FIG. 5C illustrates an example of a diagram of a circuit including the semiconductor device as a memory element. In FIG. 5C, one of a source electrode and a drain electrode of the transistor 162, one electrode of the capacitor 164, and a gate electrode of the transistor 140 are electrically connected to one another. A first wiring (1st Line, also referred to as a source line) is electrically connected to a source electrode of the transistor 140. A second wiring (2nd Line, also referred to as a bit line) is electrically connected to a drain electrode of the transistor 140. A third wiring (3rd Line, also referred to as a first signal line) is electrically connected to the other of the source electrode and the drain electrode of the transistor 162. A fourth wiring (4th Line, also referred to as a second signal line) is electrically connected to the gate electrode of the transistor 162. A fifth wiring (5th Line, also referred to as a word line) and the other electrode of the capacitor 164 are electrically connected to each other.

The off-state current of the transistor 162 including an oxide semiconductor is extremely small; therefore, when the transistor 162 is in an off state, a potential of a node (hereinafter, a node FG) where the one of the source electrode and drain electrode of the transistor 162, the one electrode of the capacitor 164, and the gate electrode of the transistor 140 are electrically connected to one another can be held for an extremely long time. The capacitor 164 facilitates holding of charge given to the node FG and reading of the held data.

When data is stored in the semiconductor device (in writing of data), the potential of the fourth wiring is set to a potential at which the transistor 162 is turned on, whereby the transistor 162 is turned on. Thus, the potential of the third wiring is applied to the node FG and a predetermined amount of charge is accumulated in the node FG. Here, charge for applying either of two different potential levels (hereinafter referred to as a low-level charge and a high-level charge) is given to the node FG. After that, the potential of the fourth wiring is set to a potential at which the transistor 162 is turned off, whereby the transistor 162 is turned off. This makes the node FG floating and the predetermined amount of charge is held in the node FG. The predetermined amount of charge is thus accumulated and held in the node FG, whereby the memory cell can store data.

Since the off-state current of the transistor 162 is extremely small, the charge applied to the node FG is held for a long time. This can remove the need of refresh operation or drastically reduce the frequency of the refresh operation, which leads to a sufficient reduction in power consumption. Moreover, stored data can be stored for a long time even when power is not supplied.

When stored data is read out (in reading of data), while a predetermined potential (fixed potential) is applied to the first wiring, an appropriate potential (read-out potential) is applied to the fifth wiring, whereby the transistor 140 changes its state depending on the amount of charge held in the node FG. This is because in general, when the transistor 140 is an n-channel transistor, a pseudo threshold value $V_{th\_H}$ of the transistor 140 in the case where the high-level charge is held in the node FG is lower than a pseudo threshold value $V_{th\_L}$ of the transistor 140 in the case where the low-level charge is held in the node FG. Here, a pseudo threshold voltage refers to the potential of the fifth wiring, which is needed to turn on the transistor 140. Thus, by setting the potential of the fifth wiring to a potential $V_0$ which is between $V_{th\_H}$ and $V_{th\_L}$, charge held in the node FG can be determined. For example, in the case where a high-level charge is given in writing, when the potential of the fifth wiring is set to $V_0$ ($>V_{th\_H}$), the transistor 140 is turned on. In the case where a low level charge is given in writing, even when the potential of the fifth wiring is set to $V_0$ ($<V_{th\_L}$), the transistor 140 remains in an off state. In such a manner, by controlling the potential of the fifth wiring and determining whether the transistor 140 is in an on state or off state (reading out the potential of the second wiring), stored data can be read out.

Further, in order to rewrite stored data, a new potential is applied to the node FG that is holding the predetermined amount of charge given in the above writing, so that the charge of new data is held in the node FG. Specifically, the potential of the fourth wiring is set to a potential at which the transistor 162 is turned on, whereby the transistor 162 is turned on. The potential of the third wiring (potential of new data) is applied to the node FG, and the predetermined amount of charge is accumulated in the node FG. After that, the potential of the fourth wiring is set to a potential at which the transistor 162 is turned off, whereby the transistor 162 is turned off. Thus, charge of the new data is held in the node FG. In other words, while the predetermined amount of charge given in a first writing is held in the node FG, the same operation (second writing) as in the first writing is performed, whereby the stored data can be overwritten.

The off-state current of the transistor 162 described in this embodiment can be sufficiently reduced by using the highly purified oxide semiconductor layer containing excess oxygen as the crystalline oxide semiconductor layer 144. By using such a transistor, a semiconductor device in which stored data can be stored for an extremely long time can be obtained.

As described above, a transistor which includes a highly purified crystalline oxide semiconductor layer containing excess oxygen which compensates an oxygen vacancy has less variation in electric characteristics and is electrically stable. Thus, by using the transistor, a highly reliable semiconductor device can be provided.

The methods, configurations, and the like described in this embodiment can be combined with any of the methods, configurations, and the like described in the other embodiments, as appropriate.

Embodiment 8

A semiconductor device disclosed in this specification can be applied to a variety of electronic appliances (including game machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large game machine such as a pachinko machine, and the like. Examples of electronic appliances each including the semiconductor device described in any of the above embodiments will be described.

Figure 11A:
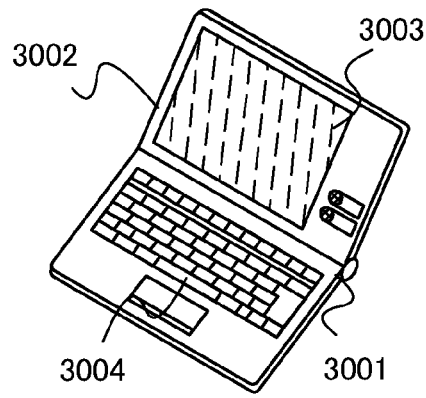
FIGS. 11A to 11F each illustrate an electronic appliance.

FIG. 11A illustrates a laptop personal computer, which includes a main body 3001, a housing 3002, a display portion 3003, a keyboard 3004, and the like. When the semiconductor device described in any of Embodiments 1 to 7 is applied to the display portion 3003, a highly reliable laptop personal computer can be provided.

Figure 11B:
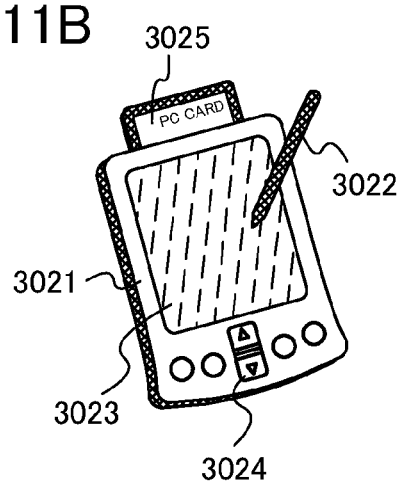

FIG. 11B illustrates a personal digital assistant (PDA), which includes a main body 3021 provided with a display portion 3023, an external interface 3025, operation buttons 3024, and the like. A stylus 3022 is included as an accessory for operation. When the semiconductor device described in any of Embodiments 1 to 7 is applied to the display portion 3023, a highly reliable personal digital assistant (PDA) can be provided.

Figure 11C:
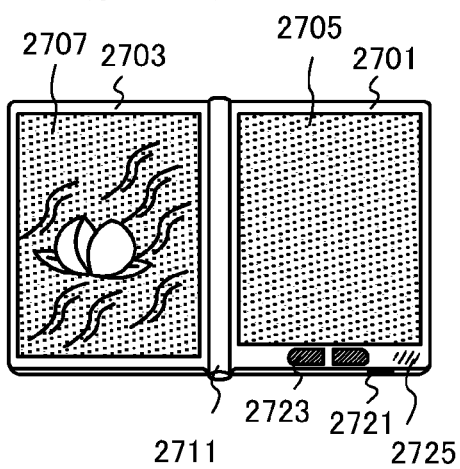

FIG. 11C illustrates an example of an electronic book reader. For example, the electronic book reader includes two housings, a housing 2701 and a housing 2703. The housing 2701 and the housing 2703 are combined with a hinge 2711 so that the electronic book reader can be opened and closed with the hinge 2711 as an axis. With such a structure, the electronic book reader can operate like a paper book.

A display portion 2705 and a display portion 2707 are incorporated in the housing 2701 and the housing 2703, respectively. The display portion 2705 and the display portion 2707 may display one image or different images. In the configuration where different images are displayed on different display portions, for example, the right display portion (the display portion 2705 in FIG. 11C) can display text and the left display portion (the display portion 2707 in FIG. 11C) can display graphics. When the semiconductor device described in any of Embodiments 1 to 7 is applied to the display portions 2705 and 2707, a highly reliable electronic book reader can be provided. In the case of using a transflective or reflective liquid crystal display device as the display portion 2705, the electronic book reader may be used in a comparatively bright environment; therefore, a solar cell may be provided so that power generation by the solar cell and charge by a battery can be performed. When a lithium ion battery is used as the battery, there is an advantage of downsizing or the like.

FIG. 11C illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (earphone terminal, USB terminal, or the like), a recording medium insertion portion, and the like may be provided on the back surface or the side surface of the housing. Moreover, the electronic book reader may have a function of an electronic dictionary.

The electronic book reader may be configured to be able to transmit and receive data wirelessly. Through wireless communication, desired book data or the like can be purchased and downloaded from an electronic book server.

Figure 11D:
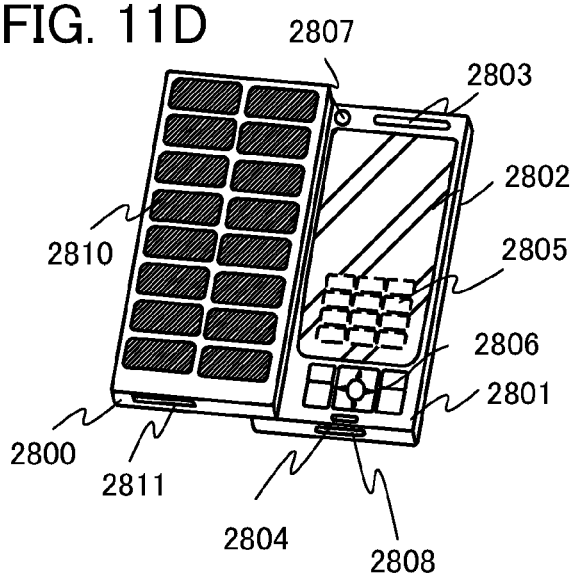

FIG. 11D illustrates a mobile phone including two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the mobile phone, an external memory slot 2811, and the like. Further, an antenna is incorporated in the housing 2801. When the semiconductor device described in any of Embodiments 1 to 7 is applied to the display panel 2802, a highly reliable mobile phone can be provided.

The display panel 2802 is provided with a touch panel. A plurality of operation keys 2805 displayed as images are illustrated by dashed lines in FIG. 11D. Note that a boosting circuit by which a voltage output from the solar cell 2810 is increased to be sufficiently high for each circuit is also included.

In the display panel 2802, the display direction can be appropriately changed depending on a usage pattern. Further, the display device is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housings 2800 and 2801 in a state where they are developed as illustrated in FIG. 11D can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a larger amount of data can be stored by inserting a storage medium into the external memory slot 2811 and can be moved.

Further, in addition to the above functions, an infrared communication function, a television reception function, or the like may be provided.

Figure 11E:
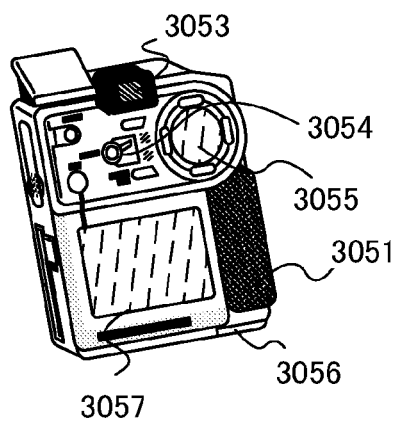

FIG. 11E illustrates a digital video camera which includes a main body 3051, a display portion A 3057, an eyepiece portion 3053, an operation switch 3054, a display portion B 3055, a battery 3056, and the like. When the semiconductor device described in any of Embodiments 1 to 7 is applied to the display portion A 3057 and the display portion B 3055, a highly reliable digital video camera can be provided.

Figure 11F:
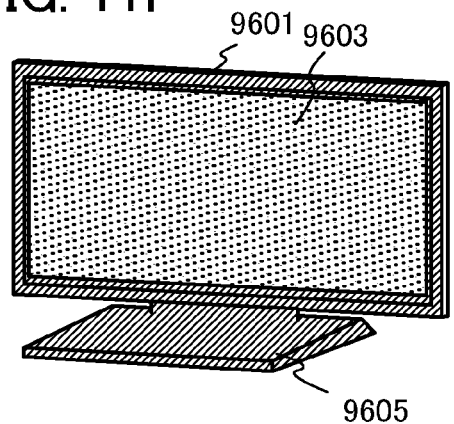

FIG. 11F illustrates an example of a television set. In the television set, a display portion 9603 is incorporated in a housing 9601. The display portion 9603 can display images. Here, the housing 9601 is supported by a stand 9605. When the semiconductor device described in any of Embodiments 1 to 7 is applied to the display portion 9603, a highly reliable television set can be provided.

The television set can be operated by an operation switch of the housing 9601 or a separate remote controller. Further, the remote controller may be provided with a display portion for displaying data output from the remote controller.

Note that the television set is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Embodiment 8 can be implemented in appropriate combination with the configuration described in the other embodiments.

EXAMPLE

In this example, properties of an aluminum oxide film used as a barrier film in a semiconductor device according to one embodiment of the disclosed invention were evaluated. The results are shown in FIGS. 13A1, 13A2, 13B1, and 13B2, FIGS. 14A1, 14A2, 14B1, and 14B2, FIGS. 15A to 15D, and FIGS. 16A to 16D. As evaluation methods, secondary ion mass spectrometry (SIMS) and thermal desorption spectrometry (TDS) were used.

First, evaluation by SIMS analysis is described. As a comparative example, a comparative sample A was fabricated in such a manner that a silicon oxide film was formed to a thickness of 100 nm over a glass substrate by a sputtering method. Further, as an example, an example sample A was fabricated in such a manner that a silicon oxide film was formed to a thickness of 100 nm over a glass substrate by a sputtering method, and an aluminum oxide film was formed to a thickness of 100 nm over the silicon oxide film by a sputtering method.

For each of the comparative sample A and the example sample A, the silicon oxide film was formed under the following conditions: a silicon oxide ($SiO_2$) target was used as a target, the distance between the glass substrate and the target was 60 mm, the pressure was 0.4 Pa, the power of the power source was 1.5 kW, the atmosphere was an oxygen atmosphere (the oxygen flow rate was 50 sccm), and the substrate temperature was 100° C.

For the example sample A, the aluminum oxide film was formed under the following conditions: an aluminum oxide ($Al_2O_3$) target was used as a target, the distance between the glass substrate and the target was 60 mm, the pressure was 0.4 Pa, the power of the power source was 1.5 kW, the atmosphere was a mixed atmosphere containing argon and oxygen (the argon flow rate was 25 sccm and the oxygen flow rate was 25 sccm), and the substrate temperature was 250° C.

The comparative sample A and the example sample A were each subjected to a pressure cooker test (PCT). In the PCT in this example, the comparative sample A and the example sample A were held for 100 hours under the following conditions: the temperature was 130° C., the humidity was 85%, the atmosphere was an atmosphere where $H_2O$ (water):$D_2O$ (deuterium oxide)=3:1, and the atmospheric pressure was 2.3 atm (0.23 MPa).

As SIMS analysis, substrate side depth profile (SSDP) SIMS was used to measure concentrations of an H atom and a D atom in the comparative sample A and the example sample A before and after the PCT.

FIG. 13A1 shows H atom and D atom concentration profiles of the comparative sample A before the PCT, and FIG. 13A2 shows H atom and D atom concentration profiles of the comparative sample A after the PCT, which were obtained using SIMS. In FIGS. 13A1 and 13A2, a D atom expected concentration profile is a calculated concentration profile of the D atom existing in nature, which was obtained using the H atom concentration profile on the assumption that the abundance ratio of the D atom thereto is 0.015%. Therefore, the amount of the D atom mixed into the sample by the PCT equals the difference between the measured D atom concentration after the PCT and the D atom expected concentration after the PCT. FIG. 13B1 shows a D atom concentration profile before the PCT, which was obtained by subtracting the D atom expected concentration from the measured D atom concentration, and FIG. 13B2 shows a D atom concentration profile after the PCT, which was obtained by subtracting the D atom expected concentration from the measured D atom concentration.

In a similar manner, FIG. 14A1 shows H atom and D atom concentration profiles of the example sample A before the PCT, and FIG. 14A2 shows H atom and D atom concentration profiles of the example sample A after the PCT, which were obtained using SIMS. Further, FIG. 14B1 shows a D atom concentration profile before the PCT, which was obtained by subtracting the D atom expected concentration from the measured D atom concentration, and FIG. 14B2 shows a D atom concentration profile after the PCT, which was obtained by subtracting the D atom expected concentration from the measured D atom concentration.

Note that all the results of SIMS analysis in this example were quantified using a standard sample of a silicon oxide film.

As shown in FIGS. 13A1, 13A2, 13B1, and 13B2, while the measured D atom concentration profile overlaps with the D atom expected concentration profile before the PCT, the measured D atom concentration greatly increases after the PCT; accordingly, it is found that the D atom was mixed into the silicon oxide film. Therefore, it is confirmed that the silicon oxide film of the comparative sample has a low barrier property with respect to moisture ($H_2O$ and $D_2O$) from the outside.

In contrast, as shown in FIGS. 14A1, 14A2, 14B1, and 14B2, as for the example sample A in which the aluminum oxide film was stacked over the silicon oxide film, it is found that only a slight amount of D atom entered a region close to a surface of the aluminum oxide film by the PCT and that the D atom entered neither the aluminum oxide film at a depth around 30 nm or greater nor the silicon oxide film. Therefore, it is confirmed that the aluminum oxide film has a high barrier property with respect to moisture ($H_2O$ and $D_2O$) from the outside.

The following shows evaluation by TDS analysis. As an example, an example sample B was fabricated in such a manner that a silicon oxide film was formed to a thickness of 100 nm over a glass substrate by a sputtering method, and an aluminum oxide film was formed to a thickness of 20 nm over the silicon oxide film by a sputtering method. Further, as a comparative example, a comparative sample B was fabricated in such a manner that after the example sample B was measured by TDS analysis, the aluminum oxide film thereof was removed, and only the silicon oxide film was left over the glass substrate.

For each of the comparative sample B and the example sample B, the silicon oxide film was formed under the following conditions: a silicon oxide ($SiO_2$) target was used as a target, the distance between the glass substrate and the target was 60 mm, the pressure was 0.4 Pa, the power of the power source was 1.5 kW, the atmosphere was an oxygen atmosphere (the oxygen flow rate was 50 sccm), and the substrate temperature was 100° C.

For the example sample B, the aluminum oxide film was formed under the following conditions: an aluminum oxide ($Al_2O_3$) target was used as a target, the distance between the glass substrate and the target was 60 mm, the pressure was 0.4 Pa, the power of the power source was 1.5 kW, the atmosphere was a mixed atmosphere containing argon and oxygen (the argon flow rate was 25 sccm and the oxygen flow rate was 25 sccm), and the substrate temperature was 250° C.

Other three types of the comparative sample B and the example sample B were fabricated by further performing heat treatment at 300° C., 450° C., and 600° C., respectively. The heat treatment was performed for 1 hour in a nitrogen atmosphere for each sample.

Figure 15A:
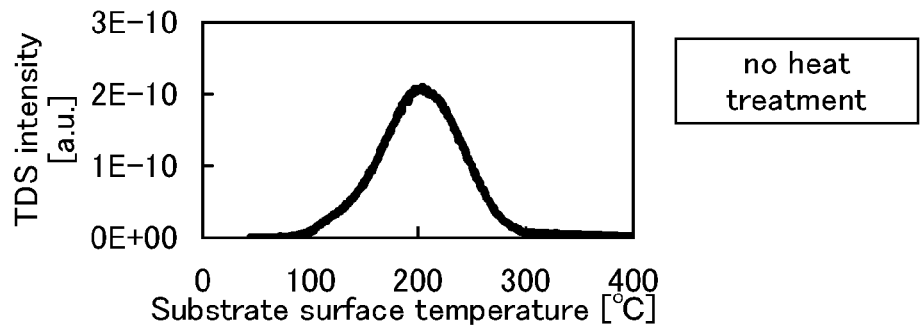
FIGS. 15A to 15D show TDS data of a comparative sample B.
Figure 15B:
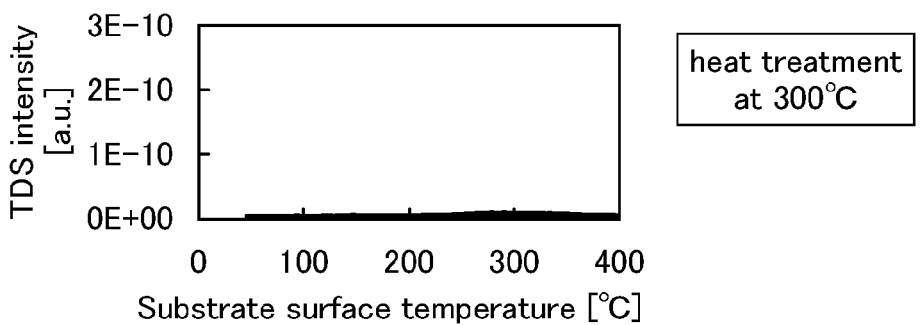
Figure 15C:
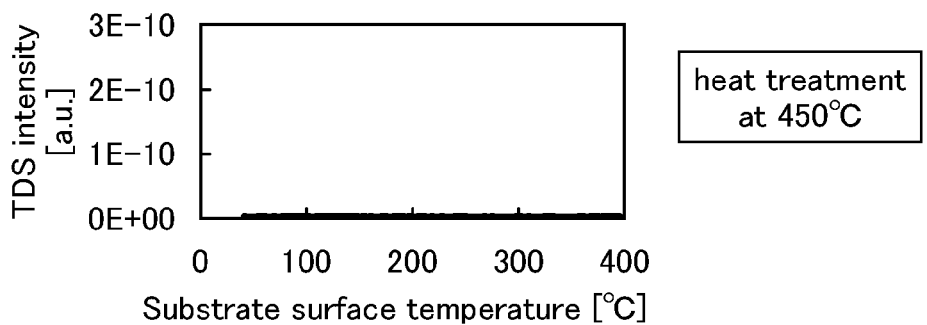
Figure 15D:
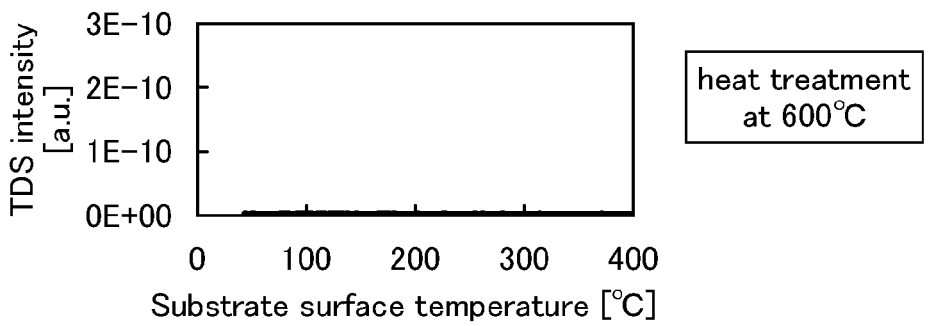
Figure 16A:
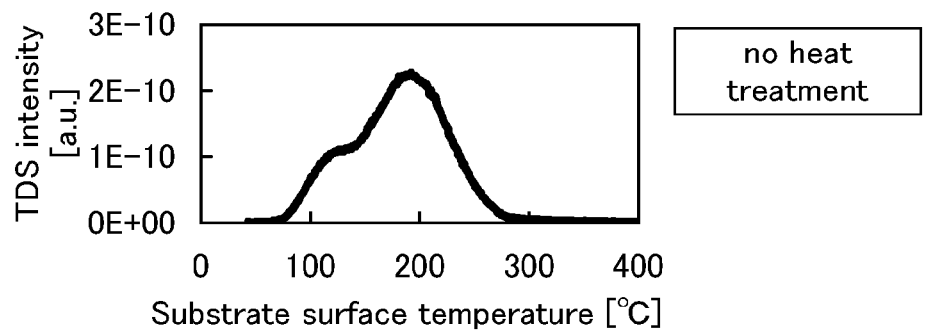
FIGS. 16A to 16D show TDS data of an example sample B.
Figure 16B:
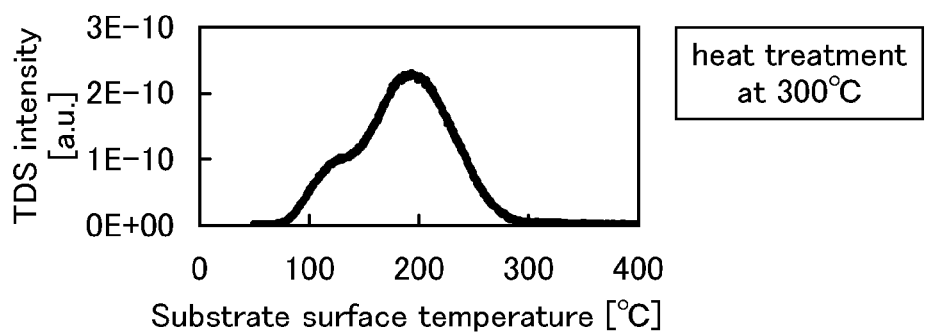
Figure 16C:
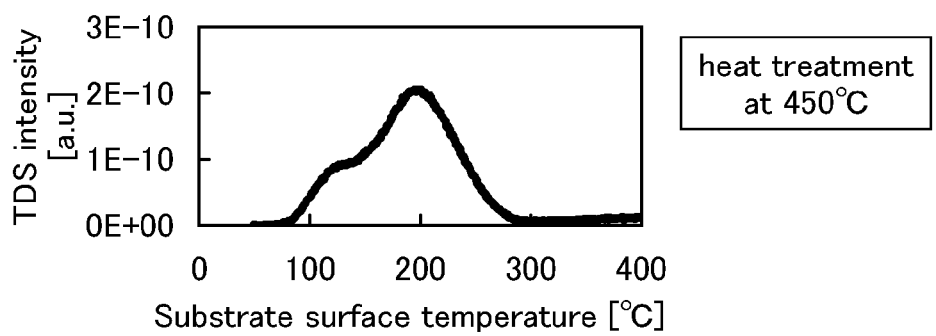
Figure 16D:
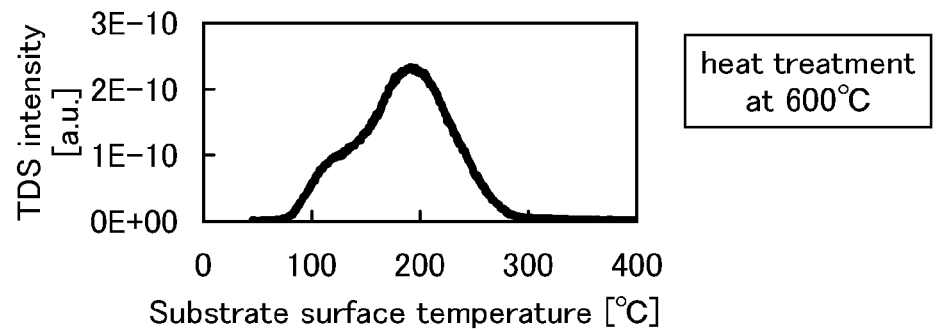

TDS analysis was performed on the four types of the comparative sample B and the four types of the example sample B fabricated under the respective four conditions (without heat treatment, with 300° C. heat treatment, with 450° C. heat treatment, and with 600° C. heat treatment). FIG. 15A shows a TDS spectrum of the comparative sample B subjected to no heat treatment, FIG. 15B shows that of the comparative sample B subjected to heat treatment at 300° C., FIG. 15C shows that of the comparative sample B subjected to heat treatment at 450° C., and FIG. 15D shows that of the comparative sample B subjected to heat treatment at 600° C., each at M/z=32 ($O_2$). Further, FIG. 16A shows a TDS spectrum of the example sample B subjected to no heat treatment, FIG. 16B shows that of the example sample B subjected to heat treatment at 300° C., FIG. 16C shows that of the example sample B subjected to heat treatment at 450° C., and FIG. 16D shows that of the example sample B subjected to heat treatment at 600° C., each at M/z=32 ($O_2$).

As shown in FIGS. 15A to 15D, it can be seen in FIG. 15A that oxygen was released from the silicon oxide film of the comparative sample B which was not subjected to heat treatment, but the amount of oxygen released was greatly decreased in the comparative sample B subjected to the heat treatment at 300° C. in FIG. 15B, and became smaller than or equal to a background level of TDS measurement in the comparative sample B subjected to the heat treatment at 450° C. in FIG. 15C and the comparative sample B subjected to the heat treatment at 600° C. in FIG. 15D.

The results in FIGS. 15A to 15D indicate that 90% or more of excess oxygen contained in the silicon oxide film was released outside the silicon oxide film by the heat treatment at 300° C. and that substantially all of the excess oxygen contained in the silicon oxide film was released outside the silicon oxide film by the heat treatment at 450° C. and 600° C. Therefore, it is confirmed that the silicon oxide film has a low barrier property with respect to oxygen.

In contrast, as shown in FIGS. 16A to 16D, substantially the same amount of oxygen was released from every type of the example sample B, in which the aluminum oxide film was formed over the silicon oxide film, regardless of whether the heat treatment was not performed or was performed at 300° C., 450° C., and 600° C.

The results in FIGS. 16A to 16D indicate that when the aluminum oxide film was formed over the silicon oxide film, the excess oxygen contained in the silicon oxide film was not easily released to the outside by heat treatment and the state where the excess oxygen was contained in the silicon oxide film was held to a considerable extent. Therefore, it is confirmed that the aluminum oxide film has a high barrier property with respect to oxygen.

The above results confirm that the aluminum oxide film has both a high barrier property with respect to hydrogen and moisture and a high barrier property with respect to oxygen, and serves suitably as a barrier film with respect to hydrogen, moisture, and oxygen.

Accordingly, the aluminum oxide film serves as a protection film that prevents entry of impurities such as hydrogen and moisture, which cause variation in the electric characteristics of a transistor, into the oxide semiconductor layer and release of oxygen, which is a main component material of the oxide semiconductor, from the oxide semiconductor layer during and after a process of manufacturing a transistor including an oxide semiconductor layer.

Therefore, the crystalline oxide semiconductor layer formed has high purity because impurities such as hydrogen and moisture are not mixed therein, and includes the region containing excess oxygen as compared to a stoichiometric composition ratio of an oxide semiconductor in a crystalline state because oxygen is prevented from being released. Accordingly, by using the crystalline oxide semiconductor layer for the transistor, it is possible to reduce variation in the threshold voltage ($V_{th}$) of the transistor due to an oxygen vacancy and a shift of the threshold voltage ($\Delta V_{th}$).

This application is based on Japanese Patent Application serial no. 2011-054815 filed with Japan Patent Office on Mar. 11, 2011, the entire contents of which are hereby incorporated by reference.

What is claimed is:

1. A method of manufacturing a semiconductor device comprising the steps of:
  forming a silicon oxide film;
  forming an amorphous oxide semiconductor layer over the silicon oxide film;
  performing a first heat treatment on the amorphous oxide semiconductor layer;
  forming an aluminum oxide film over the amorphous oxide semiconductor layer, after performing the first heat treatment; and
  after forming the aluminum oxide film, performing a second heat treatment on the amorphous oxide semiconductor layer,
  wherein the amorphous oxide semiconductor layer includes a region containing excess oxygen as compared to a stoichiometric composition ratio of an oxide semiconductor in a crystalline state, and
  wherein the second heat treatment is performed at a temperature higher than a temperature of the first heat treatment.

2. The method of manufacturing the semiconductor device according to claim 1, wherein the second heat treatment is performed so that a part of the amorphous oxide semiconductor layer is crystallized and an oxide semiconductor layer which includes a crystal having a c-axis substantially perpendicular to a surface of the oxide semiconductor layer is formed.

3. The method of manufacturing the semiconductor device according to claim 1, wherein the first heat treatment is performed so that hydrogen or moisture contained in the amorphous oxide semiconductor layer is released.

4. The method of manufacturing the semiconductor device according to claim 1, wherein the silicon oxide film includes a region containing excess oxygen as compared to a stoichiometric composition ratio of crystalline silicon oxide.

5. The method of manufacturing the semiconductor device according to claim 1, further comprising a step of:
forming an oxide insulating film between the amorphous oxide semiconductor layer and the aluminum oxide film.

6. The method of manufacturing the semiconductor device according to claim 1, wherein the silicon oxide film and the amorphous oxide semiconductor layer are successively formed without exposure to air.

7. The method of manufacturing the semiconductor device according to claim 1, wherein the amorphous oxide semiconductor layer comprises a three-component metal oxide.

8. A method of manufacturing a semiconductor device comprising the steps of:
forming a silicon oxide film;
forming an amorphous oxide semiconductor layer over the silicon oxide film;
performing a first heat treatment on the amorphous oxide semiconductor layer;
forming a source electrode layer and a drain electrode layer, which are in contact with the amorphous oxide semiconductor layer;
forming an aluminum oxide film over the amorphous oxide semiconductor layer, after performing the first heat treatment; and
after forming the aluminum oxide film, performing a second heat treatment on the amorphous oxide semiconductor layer, thereby forming an oxide semiconductor layer comprising a channel formation region,
wherein the amorphous oxide semiconductor layer includes a region containing excess oxygen as compared to a stoichiometric composition ratio of an oxide semiconductor in a crystalline state, and
wherein the second heat treatment is performed at a temperature higher than a temperature of the first heat treatment.

9. The method of manufacturing the semiconductor device according to claim 8, wherein the second heat treatment is performed so that a part of the amorphous oxide semiconductor layer is crystallized and an oxide semiconductor layer which includes a crystal having a c-axis substantially perpendicular to a surface of the oxide semiconductor layer is formed.

10. The method of manufacturing the semiconductor device according to claim 8, wherein the first heat treatment is performed so that hydrogen or moisture contained in the amorphous oxide semiconductor layer is released.

11. The method of manufacturing the semiconductor device according to claim 8, wherein the silicon oxide film includes a region containing excess oxygen as compared to a stoichiometric composition ratio of crystalline silicon oxide.

12. The method of manufacturing the semiconductor device according to claim 8, further comprising a step of:
forming an oxide insulating film between the amorphous oxide semiconductor layer and the aluminum oxide film.

13. The method of manufacturing the semiconductor device according to claim 8, wherein the silicon oxide film and the amorphous oxide semiconductor layer are successively formed without exposure to air.

14. The method of manufacturing the semiconductor device according to claim 8, wherein the amorphous oxide semiconductor layer comprises a three-component metal oxide.

* * * * *